United States Patent
Lemkin et al.

(10) Patent No.: US 10,914,789 B2
(45) Date of Patent: Feb. 9, 2021

(54) WIRELESS SENSING FOR BATTERY SYSTEMS

(71) Applicants: Analog Devices International Unlimited Company, Limerick (IE); Linear Technology Corporation, Milpitas, CA (US)

(72) Inventors: Mark Alan Lemkin, Berkeley, CA (US); Alain Pierre Levesque, Broward County, FL (US); Brett Warneke, Castro Valley, CA (US); David McLean Dwelley, Santa Barbara, CA (US); Erik Soule, Milpitas, CA (US); Lance Robert Doherty, Boston, MA (US); Gordon Alexander Charles, Sunnyvale, CA (US); Thor Nelson Juneau, Menlo Park, CA (US); Jonathan Noah Simon, Castro Valley, CA (US); Robert Dobkin, Monte Sereno, CA (US)

(73) Assignee: Analog Devices International Unlimited Company, Limerick (IE)

(*) Notice: Subject to any disclaimer, the term of this patent is extended or adjusted under 35 U.S.C. 154(b) by 66 days.

(21) Appl. No.: 16/312,125

(22) PCT Filed: Jun. 28, 2017

(86) PCT No.: PCT/US2017/039722
§ 371 (c)(1),
(2) Date: Dec. 20, 2018

(87) PCT Pub. No.: WO2018/005631
PCT Pub. Date: Jan. 4, 2018

(65) Prior Publication Data
US 2019/0242949 A1 Aug. 8, 2019

Related U.S. Application Data

(60) Provisional application No. 62/355,733, filed on Jun. 28, 2016.

(51) Int. Cl.
*G01R 31/00* (2006.01)
*G01R 31/396* (2019.01)
(Continued)

(52) U.S. Cl.
CPC ....... *G01R 31/396* (2019.01); *G01R 31/3842* (2019.01); *H01M 10/42* (2013.01);
(Continued)

(58) Field of Classification Search
USPC ......... 324/426, 430, 433, 435; 320/120, 124
See application file for complete search history.

(56) References Cited

U.S. PATENT DOCUMENTS 6,329,792 B1 12/2001 Dunn et al.
7,228,447 B1 6/2007 Day
(Continued)

FOREIGN PATENT DOCUMENTS

CA 2209817 1/1998
CN 102810878 12/2012
(Continued)

OTHER PUBLICATIONS

"Japanese Application Serial No. 2018-567724, Voluntary Amendment Filed Jan. 7, 2019", with English Claims, 18 pgs.
(Continued)

*Primary Examiner* — Vincent Q Nguyen
(74) *Attorney, Agent, or Firm* — Schwegman Lundberg & Woessner, P.A.

(57) ABSTRACT

A battery system monitor includes cell measurement circuits (CMCs) that each measure a voltage at or current through a pair of terminals of a respective associated battery module
(Continued)

from among a plurality of plurality of battery modules in a battery system. Wireless communication transceivers (WCTs), each associated with a different CMC, transmit voltage or current measurement information of the associated CMC across a wireless communication link. A controller receives the voltage or current measurement information from the wireless communication transceivers for monitoring the state of operation of the battery system. Battery system monitoring is improved through synchronization of clocks in different CMCs or WCTs to enable synchronous sampling of multiple battery modules, through systems for determining relative positions of battery modules in a series coupling of battery modules between terminals of the battery system, and through improvements to the reliability of wireless communication.

19 Claims, 6 Drawing Sheets

(51) Int. Cl.
  H01M 10/42 (2006.01)
  H01M 10/48 (2006.01)
  G01R 31/3842 (2019.01)
  G01R 31/371 (2019.01)

(52) U.S. Cl.
  CPC ......... H01M 10/425 (2013.01); H01M 10/48 (2013.01); H01M 10/482 (2013.01); *G01R 31/371* (2019.01); *H01M 2010/4271* (2013.01); *H01M 2010/4278* (2013.01)

(56) References Cited

U.S. PATENT DOCUMENTS

| | | | |
|---|---|---|---|
| 7,548,151 | B2 | 6/2009 | Roosli et al. |
| 2004/0164706 | A1 | 8/2004 | Osborne |
| 2007/0146115 | A1* | 6/2007 | Roosli ............... G07C 9/00944 340/5.6 |
| 2009/0066291 | A1 | 3/2009 | Tien et al. |
| 2010/0302011 | A1* | 12/2010 | Cervinka ......... H04W 52/0216 340/10.3 |
| 2012/0098439 | A1* | 4/2012 | Recker ................ H05B 47/19 315/152 |
| 2013/0080095 | A1 | 3/2013 | Rocci et al. |
| 2014/0354291 | A1 | 12/2014 | Kikuchi et al. |
| 2015/0028816 | A1 | 1/2015 | Lee |

FOREIGN PATENT DOCUMENTS

| | | |
|---|---|---|
| CN | 103620432 | 3/2014 |
| CN | 105186610 | 12/2015 |
| CN | 109416389 | 3/2019 |
| EP | 2980912 A1 | 2/2016 |
| JP | 2019527528 A | 9/2019 |
| WO | WO-9932323 A1 | 7/1999 |
| WO | 2013051157 | 4/2013 |
| WO | 2014156264 | 10/2014 |
| WO | WO-2018005631 A1 | 1/2018 |

OTHER PUBLICATIONS

"International Application Serial No. PCT US2017 039722, International Preliminary Report on Patentability dated Jan. 10, 2019", 7 pgs.

"International Application Serial No. PCT/US2017/039722, Written Opinion dated Oct. 3, 2017", 5 pgs.

"International Application Serial No. PCT/US2017/039722, International Search Report dated Oct. 3, 2017", 5 pgs.

"European Application Serial No. 17821141.3, Extended European Search Report dated Dec. 12, 2019", 9 pgs.

"European Application Serial No. 17821141.3, Response filed Jul. 31, 2019 to Communication pursuant to Rules 161(2) and 162 EPC dated Feb. 5, 2019", w/ English Claims, 20 pgs.

"Chinese Application Serial No. 201780039872.0, Office Action dated Sep. 16, 2020", w/ English Translation, 15 pgs.

\* cited by examiner

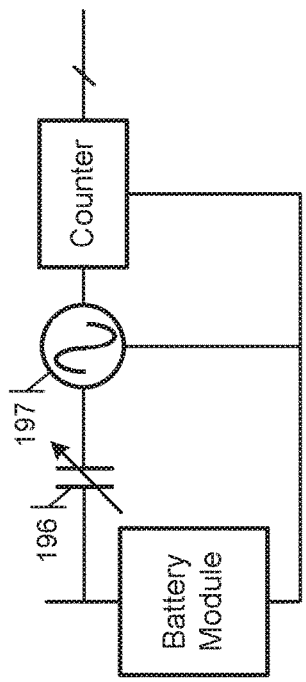
FIG. 1G
FIG. 1H
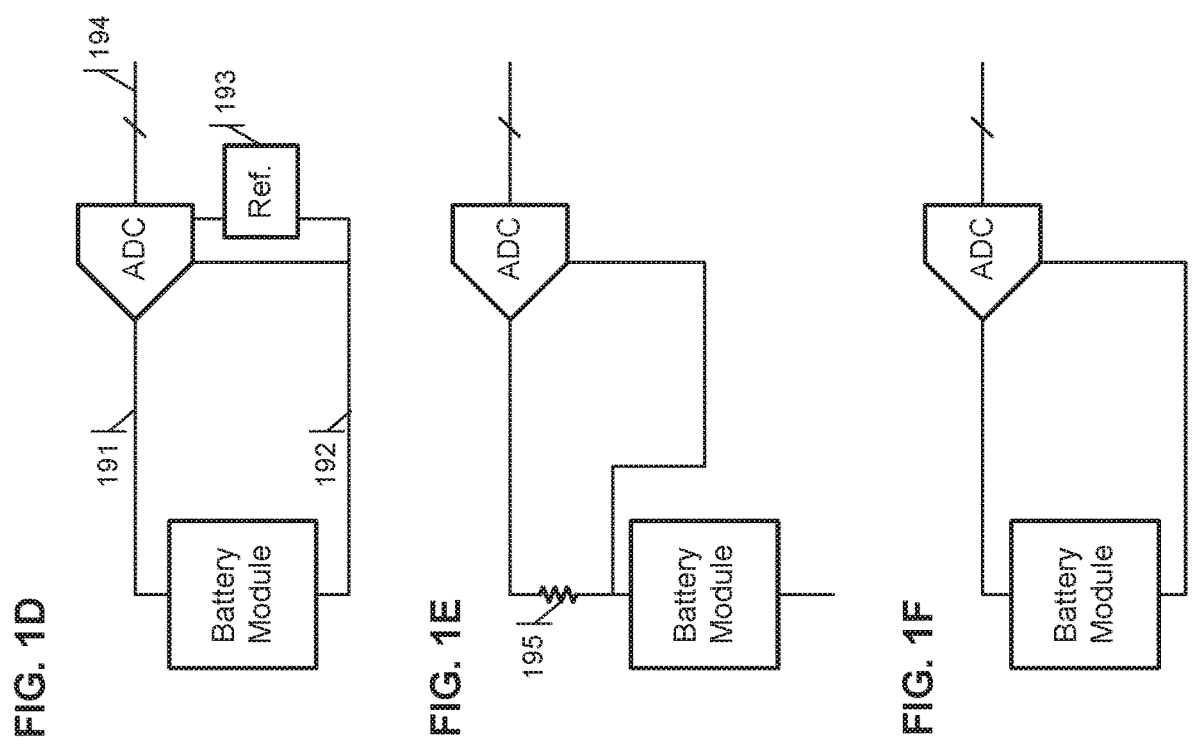
FIG. 1D
FIG. 1E
FIG. 1F

104/106

104/106

104/106

104/106

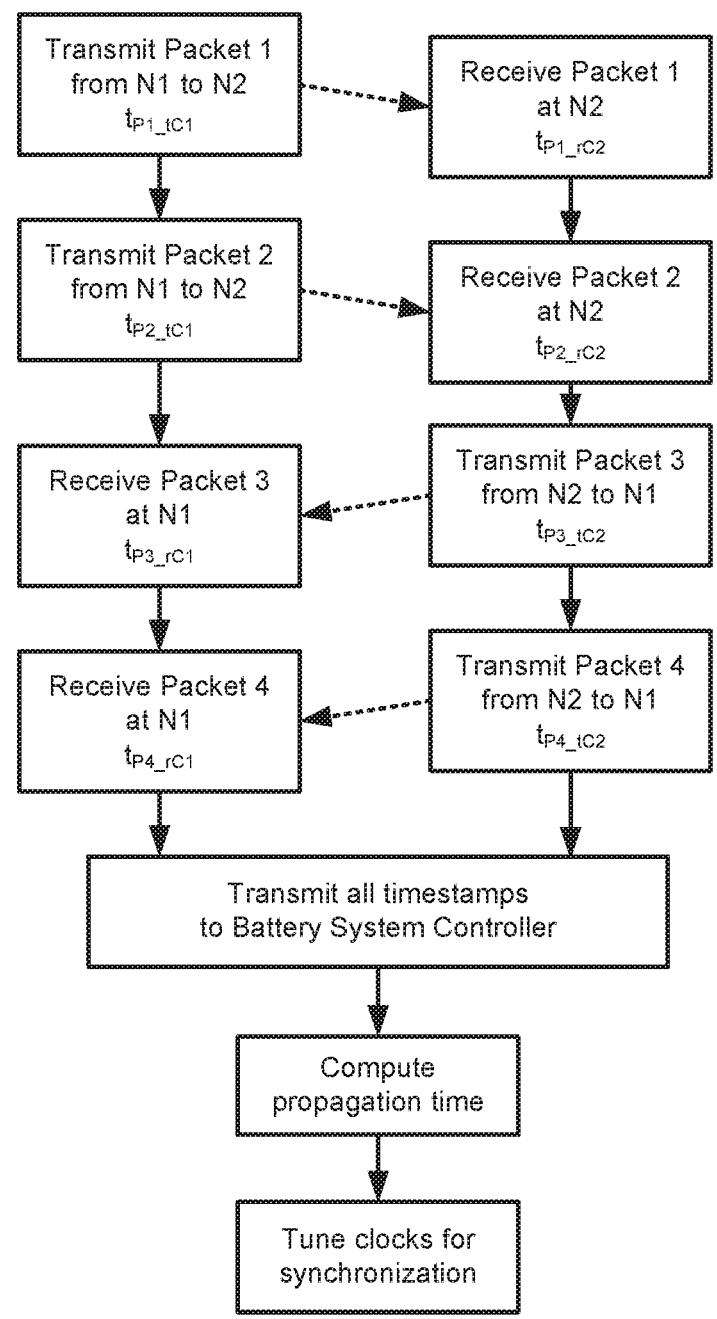

WIRELESS SENSING FOR BATTERY SYSTEMS

CROSS-REFERENCE TO RELATED APPLICATION

This application is a U.S. National Stage Filing under 35 U.S.C. § 371 of International Patent Application Serial No. PCT/US2017/039722, filed Jun. 28, 2017, and published on Jan. 4, 2018, as WO 2018/005631, which claims the benefit of U.S. Provisional Patent Application No. 62/355,733, filed on Jun. 28, 2016 in the U.S. Patent and Trademark Office, the disclosure of which are incorporated by reference herein in their entirety.

TECHNICAL FIELD

The present subject matter relates to techniques and equipment for monitoring battery system operation and performance using wireless sensing.

BACKGROUND

Large battery systems are increasingly being used to store electrical energy for future use. For example, in the case of renewable energy production, large scale battery systems can be used to store generated energy (e.g., energy generated by solar cells) for future use. In the case of electric vehicles (EVs), smaller scale battery systems can be used to store energy from the electrical grid or from regenerative braking for future use while driving.

A battery system is typically formed of a large number of individual battery cells. The individual battery cells may be electrochemical cells, and may be connected in series to provide a high operating voltage between terminals of the battery system.

The performance of the battery system is dependent on the performance of each of the individual battery cells: if one battery cell suffers from poor performance, the performance of the overall battery system is negatively impacted. Moreover, if one battery cell suffers from a fault, other battery cells, the battery system, and/or the system it is powering may be damaged.

A need therefore exists for monitoring the performance of battery cells in a battery system, and for controlling operation of the battery system in response to the monitored performance parameters.

SUMMARY

The teachings herein alleviate one or more of the above noted problems with battery systems including large numbers of battery cells.

In accordance with one aspect of the disclosure, a battery system monitor includes a plurality of cell measurement circuits (CMCs) each configured to measure a voltage at or current through a pair of terminals of an associate battery module from among a plurality of plurality of battery modules in a battery system. Each battery module has a pair of terminals and terminals of the battery modules are interconnected such that the battery modules are coupled in series with each other between first and second terminals of a battery system. A plurality of wireless communication transceivers, each associated with a different CMC of the plurality of CMCs, are configured to transmit voltage or current measurement information of the associated CMC across a wireless communication link. A controller is configured to receive the voltage or current measurement information from the plurality of wireless communication transceivers. The controller is configured to determine relative positions of the battery modules associated with the CMCs in the series coupling between the first and second terminals of the battery system based on measurements received from the plurality of wireless communication transceivers.

In accordance with another aspect of the disclosure, a battery system monitor includes a plurality of cell measurement circuits (CMCs) each configured to measure a voltage at or current through a pair of terminals of a corresponding battery module from among a plurality of plurality of battery modules in a battery system. Each battery module has a pair of terminals and terminals of the battery modules are interconnected such that the battery modules are coupled in series with each other between first and second terminals of a battery system. A plurality of wireless communication transceivers, each associated with a different CMC of the plurality of CMCs, are configured to transmit voltage or current measurement information of the associated CMC across a wireless communication link. A controller is configured to receive the voltage or current measurement information from the plurality of wireless communication transceivers. A plurality of circuit components, each associated with a different CMC of the plurality of CMCs, are each coupled between a common node and a node of the associated CMC and each have an impedance or reactance that varies with the voltage across the circuit component. Each CMC is configured to measure an impedance or reactance of the associated circuit component, each wireless communication transceiver is configured to transmit the impedance or reactance measurement of the associated CMC across the wireless communication link, and the battery system controller is configured to determine relative positions of the battery modules associated with the CMCs in the series coupling between the first and second terminals of the battery system based on the impedance or reactance measurements received from the plurality of wireless communication transceivers.

In accordance with a further aspect of the disclosure, a battery system monitor includes a plurality of cell measurement circuits (CMCs) each configured to measure a voltage at or current through a pair of terminals of a corresponding battery module from among a plurality of plurality of battery modules in a battery system. Each battery module has a pair of terminals and terminals of the battery modules are interconnected such that the battery modules are coupled in series with each other between first and second terminals of a battery system. A plurality of wireless communication transceivers, each associated with a different CMC of the plurality of CMCs, are configured to transmit voltage or current measurement information of the associated CMC across a wireless communication link. A controller is configured to receive the voltage or current measurement information from the plurality of wireless communication transceivers. Each wireless communication transceiver or CMC has a clock. Each wireless communication transceiver is operative to synchronize its clock or the clock of the associated CMC with a clock of another wireless communication transceiver, of another CMC, or of the battery system controller. Each CMC of the plurality of CMCs is configured to measure the voltage or current of the respective battery module synchronously with measurements performed by other CMCs of the plurality of CMCs at sample times determined according to the synchronized clock.

In accordance with a further aspect of the disclosure, a method for monitoring a battery system includes establishing at least one wireless communication link between a controller of the battery system, the battery system having a plurality of battery modules coupled in series with each other between first and second terminals of the battery system, and at least one wireless communication transceiver associated with a battery module of the plurality of battery modules. Voltage or current measurement information for each of the plurality of battery modules is received in the controller across the at least one wireless communication link. Each voltage or current measurement information includes information on a voltage measured at or a current measured through a pair of terminals of the associated battery module. Relative positions of the battery modules in the series coupling between the first and second terminals of the battery system are determined based on measurement information received for each of the plurality of battery modules.

In accordance with another aspect of the disclosure, a method for monitoring a battery system includes measuring, by a cell measurement circuit (CMC), a voltage at or current through a pair of terminals of an associated battery module among a plurality of plurality of battery modules in a battery system. Voltage or current measurement information of the associated CMC is transmitted across a wireless communication link by a wireless communication transceiver associated with the CMC. The wireless communication transceiver is configured to receive a receipt-acknowledgment following the transmitting of the voltage or current measurement information of the associated CMC across the wireless communication link and, upon determining that the receipt-acknowledgment has not been received within a predetermined time period, the wireless communication transceiver re-transmits the voltage or current measurement information of the associated CMC.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIGS. 1D-1H are high-level functional block diagrams showing various illustrative measurement circuits that may be used in a CMC like that shown in FIG. 1C.

FIG. 4 is a flow diagram showing steps of an illustrative method for synchronizing clocks between wireless communication transceivers in a wireless communication network.

DETAILED DESCRIPTION

Figure 1A:
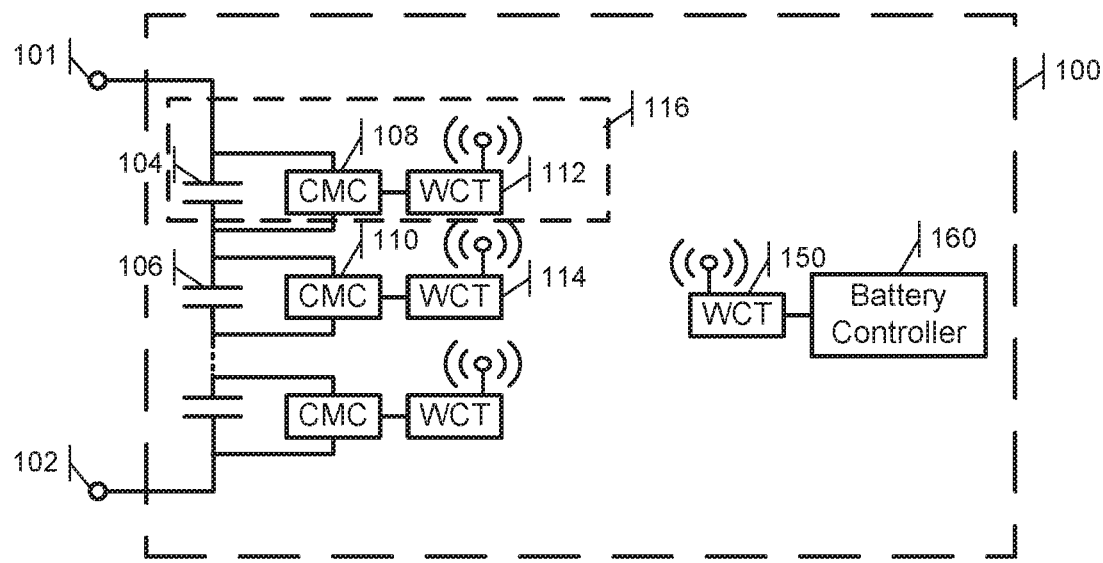
FIG. 1A is a high-level functional block diagram of a battery system including battery modules, cell measurement circuits (CMCs), wireless communication transceivers (WCTs), and a battery system controller.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various systems and method disclosed herein relate to battery systems having wireless sensing capabilities used for monitoring system operation and performance.

Systems for Wireless Monitoring of Battery Systems:

Battery systems (or battery storage systems) used in automotive (e.g., electric vehicles, EV), utility-scale storage, residential-scale storage, and other applications including high-voltage applications, incorporate a plurality of electrochemical cells to store energy. As the energy storage capacity of such battery systems increases, the number of electric battery cells becomes quite large. A battery system can thus include many hundreds or thousands of battery cells. To maximize battery system lifetime, ensure safety, level cell capacity, and provide fault detection and correction, the large collection of battery cells can benefit from monitoring and control at the individual battery cell or battery module level. A battery module may be formed of one or more battery cells connected to each other in series, parallel, and/or other appropriate interconnection. Control and monitoring of the battery modules (and battery cells therein) in such battery storage systems requires accurate measurement of individual modules' voltages or currents and communication of the measurements to a battery system controller. The battery system controller receives the battery modules' measurement data, processes the measurement data, and optionally performs an action based on the data. The measurement data can include voltage or current measurements, or data or information derived from such measurements such as power information, classification information, threshold information, or the like. Such actions can include doing nothing, shutting down individual battery cells or modules or the storage system as a whole, or the like. Such actions can further include controlling a charging or discharging current to one or more battery modules, changing electrical connections between battery modules (e.g., to electrically isolate a module suffering a fault, to slow discharge of a module having a low charge, to accelerate charge of a module having a low charge, or the like).

The battery systems often use high voltages to lower resistive losses (which are proportional to the product of current and resistance I*R) at constant power. The high voltages are generated by interconnecting multiple battery modules in a series configuration to attain the desired system voltage. Each battery module may itself be formed of one or more battery cells (which generally each have a fixed electrochemical potential) in a series and/or parallel configuration to attain the desired system voltage. Examples of such interconnections are shown in FIGS. 3A-3D.

FIG. 1A shows an illustrative battery system 100. The battery system 100 includes a plurality of battery modules 104, 106, . . . coupled in series with each other to form a series stack between nodes, wires, or terminals 101 and 102 (referenced generally herein as "terminals") of the battery system 100. The battery system voltage, measured as a difference in electrical potential between the terminals 101 and 102, may be up to a thousand volts (1000 V) or more. Moreover, the voltages of individual battery modules 104, 106 within the battery system 100 may be elevated, and may reach levels from a few volts to hundreds or thousands of volts. As a result, the battery system voltage can be measured by one or more analog-to-digital converters (ADCs) locally connected between the terminals 101 and 102.

Additionally or alternatively, battery modules' voltages can be measured by cell measurement circuits (CMCs) 108, 110 each connected to terminals of one or more battery cells in each module. The CMCs 108, 110 may include ADCs, signal conditioning circuitry, or other measurement circuitry operative to measure or condition voltage, current, or other electrical characteristics of the associated battery modules 104, 106. The CMCs 108, 110 may further each include a voltage or current reference circuit such as a buried-Zener reference or a bandgap reference for improved accuracy. In some embodiments, each CMC includes additional signal-conditioning circuits (which may be analog, digital, or a combination thereof) that may perform operations on the measurements provided by the ADC including anti-aliasing filtering, thresholding, digital filtering, analog filtering, or RMS detection. In some embodiments, each CMC measures a voltage across a cell or a plurality of cells of the associated battery module (e.g., 104 or 106). The CMC may also perform other measurements of the battery system or of subcomponents thereof including: temperature measurement for fault detection and/or feedback to a cooling system; acceleration and/or shock detection to measure, record, or respond to mechanical shocks that would pose a safety hazard or void a product warranty; detection of current through the series stack of batteries; or a measurement of an ambient acoustic or electro-magnetic signature, changes in which may be indicative of a performance issue with the battery system.

The CMCs can further optionally include switches operative to disconnect a battery module from the series stack of battery modules in the battery system 100 (e.g., by forming an electrical path bypassing the battery module), and/or to limit a current flowing into or out of the battery module. In such cases, the CMCs may receive control signals from a battery system controller 160, and may control the switches in response to the received control signals.

As described above, each CMC may include a variety of circuitry operative to measure parameters (e.g., voltage, current, temperature, or the like) of the associated battery module. In some embodiments, the CMC may further include a processor and/or memory storing programming instructions for controlling the function of the CMC. In such cases, the processor may perform analog to digital conversion of measured parameters, and/or further processing of measured parameters, prior to transmitting the parameters (or processed parameters) to the battery system controller 160.

In some battery systems, data is communicated between the CMCs 108, 110 and the battery system controller 160 using an isolated bus having one or more wires that provide isolation of the common-mode battery voltage in the stack to which the CMCs are connected. Isolation of the various CMCs provides a degree of safety, and eases the circuit design of the CMCs, as most IC process technologies are unable to support directly the high battery-system voltage. Furthermore, the lower operating voltage of the CMCs provides improved reliability since, all other things being equal, reliability decreases as the system voltage increases.

While isolators and wires provide a degree of safety, such battery systems suffer from at least the following issues: isolation circuits connected to the bus can fail and cause a safety fault; isolation circuits and the additional wiring and the additional connectors add cost; the additional wiring and associated connectors are susceptible to fracture from mechanical fatigue; insulation may rub off the wires due to vibration and cause short circuit faults; communication to the CMCs requires direct connection to the bus lines; unsecured communication signals present on the bus will radiate energy which may be detected by unauthorized users and thereby present a security threat; isolated bus communication can require messages to be passed serially between CMCs until reaching an endpoint and can thereby reduce the overall system bandwidth.

To address such shortcomings, the battery system 100 of FIG. 1A relies on the CMCs 108, 110 communicating wirelessly with the battery system controller 160. In this way, a CMC 108, 110 may pass wireless communication messages to any radio that has a sufficient communication channel between the nodes while reducing the risk of high voltage short-circuit faults.

In particular, each CMC 108, 110 has an associated wireless communication transceiver (WCT) 112, 114 configured to wirelessly communicate with a wireless communication transceiver (WCT) 150 of the battery system controller 160, either through a direct wireless link (e.g., a point-to-point link) or an indirect (e.g., multi-hop) link. For example, each wireless communication transceiver 112, 114 can transmit a voltage or current measurement of the associated CMC across a wireless communication link such that the measurement can be communicated to the battery system controller 160. In some embodiments, a processor in each wireless communication transceiver 112, 114 is used to compress data (e.g., in a lossy or lossless manner, as appropriate), filter data, or otherwise reduce the amount of information required to be transmitted to the battery controller 160 so as to thereby reduce required bandwidth and/or provide a reduced latency of the data in transit. The combination of a battery module 104 or 106, the associated CMC 108 or 110, and the associated wireless communication transceiver 112 or 114, is referenced herein as a battery module assembly 116.

The battery system 100 commonly has an operating voltage across the first and second terminals 101 and 102 that exceeds a voltage rating of at least one of the CMCs 108, 110 or one of the wireless communication transceivers 112, 114. For example, the operating voltage of the battery system may exceed 100 volts (e.g., reach voltages of over 1000 volts), while a voltage rating of each of the plurality of CMCs or wireless communication transceivers is much less than the operating voltage. For example, in an RF CMOS transceiver implemented in 0.18 μm technology, a voltage rating of the CMCs or wireless communication transceivers may be equal to or less than 3.6 volts; in a device implement using a 55 nm process technology, the voltage rating may be equal to or less than 2.5 volts or 3.3 volts; and in a BiCmos special ADC chip, a voltage rating of the CMCs or wireless communication transceivers may be equal to or less than 24 volts, 48 volts, or 50 volts depending on manufacturing process. As such, connection of a CMC or wireless communication transceiver directly across the terminals 101 and 102 of the battery system 100 could cause damage to the CMC and/or wireless communication transceiver. For this reason, each of the CMCs 108, 110 and each of the wireless communication transceivers 112, 114 is electrically isolated from at least one of the first and second terminals 101 and 102 of the battery system. For instance, in the example of FIG. 1A, CMC 108 and wireless communication transceiver 112 are electrically isolated from the second terminal 102, while CMC 110 and wireless communication transceiver 114 are electrically isolated from both the first and second terminals 101 and 102. Each battery module 104, 106 has an operating voltage that is equal to or below the voltage rating (e.g., maximum voltage rating) of each of the CMCs 108, 110 and/or wireless communication transceivers 112, 114.

To enable the CMCs 108, 110 to communicate with the battery system controller 160 while maintaining electrical isolation from each other, wireless communication is used to reliably and securely provide simultaneous electrical isolation and information-connectivity between the CMCs and an external battery controller. In the battery system 100 of FIG. 1A, the CMCs 108, 110 pass wireless communications messages either directly or indirectly to the battery system controller 160. In particular, the CMCs 108 and 110 may provide voltage, current, temperature, or other measurement data to the battery system controller 160. In turn, the battery system controller 160 can determine a battery system fault based on the voltage or current measurements received from the CMCs and associated wireless communication transceivers, and can shut down operation of the battery system upon determining the battery system fault. For example, detection of an over-voltage may be used to trigger shut down of the battery system. A battery system fault can also be determined based on determining that a voltage or current measurement has not been received within a predetermined time period from a CMC or associated wireless communication transceiver, and can trigger shut down of operation of the battery system upon determining the battery system fault.

Figure 1B:
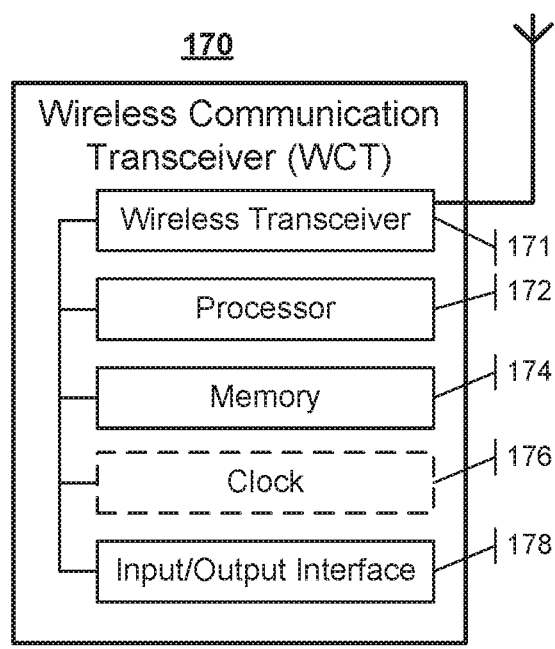
FIG. 1B is a high-level functional block diagram of a WCT as may be used in a battery system like that shown in FIG. 1A.

FIG. 1B shows an example of a wireless communication transceiver (WCT) 170 that may function as one of wireless communication transceivers 112, 114, or 150 of FIG. 1A. The WCT 170 includes a processor 172 (e.g., a microprocessor) and a memory 174 (e.g., non-volatile and/or volatile memory) that provide processing capabilities. The memory 174 stores application programs and instructions for controlling operation of the WCT 170 in the various manners described throughout this description, and the processor 172 is configured to execute the application programs and instructions stored in the memory 174. The WCT 170 further includes a wireless transceiver 171 (e.g., radio transceiver) that enables the WCT 170 to communicate wirelessly with other WCTs (e.g., 112, 114, 150 in FIG. 1A) and/or across a network (e.g., a wireless mesh-network including the other WCTs). As shown in FIG. 1B, the transceiver 171 is connected to an antenna through which data can be transmitted or received wirelessly; in other embodiments, the transceiver 171 may be (or include) a wired transceiver. The various components of the WCT 170 are communicatively connected to each other (e.g., via a bus or other communication lines).

The WCT 170 further includes an input/output interface 178 for receiving measurement data from the associated CMC and, optionally, for sending control commands to the CMC. The input/output interface 178 may be a CMC-interface through which measurement data is received from the associated CMC and through which control commands received through the antenna are relayed to the associated CMC (e.g., as may be done in the WCTs 112 and 114 of FIG. 1A). In other examples, the input/output interface 178 may be used to interface with other external components; for instance, in the case of WCT 150 of FIG. 1A, the input/output interface 178 can be used to interface with the battery system controller 160 to relay measurement data received wirelessly to the battery system controller 160 and receive control and messaging commands from the battery system controller 160 for transmission wirelessly through the antenna.

In general, the WCT 170 further includes a local clock 176 (e.g., a frequency reference) used to control timing of operation by the processor 172. In some examples, the clock 176 is shared with the associated CMC and in such examples the clock may be located in the WCT 170 or in the associated CMC. The same clock 176 or a separate crystal can be used for wireless communication purposes to synchronize operation of the transceiver with a network clock or schedule, to tune the transceiver to a particular channel or frequency for communication, or the like. The WCT 170 can function as a transmitter for transmitting measurement data to the battery system controller 160. The WCT 170 can further function as a receiver for receiving control commands from the battery system controller 160 and passing the received control commands to the associated CMC, or receiving software updates from the battery system controller 160, and the like. In some examples, the WCT 170 also functions as a network communication relay point configured to receive packets through one communication network link (e.g., a mesh network link) and retransmit the received packets through another communication network link (e.g., another link of the mesh network).

To provide the battery system 100 with a high level of reliability, the wireless communications between CMCs and the battery system controller 160 need to be dependable. Specifically, because of the large number of battery modules and associated CMCs and wireless communication transceivers in the battery system 100, even occasional faults in the wireless communications between system elements will negatively impact overall system reliability. To ensure high system reliability, the wireless communication transceivers, associated communication links, and overall wireless communication system design should provide high redundancy.

For wireless communication purposes, each CMC 108, 110 is communicatively connected to an associated wireless communication transceiver 112, 114. The information gathered by each CMC 108, 110 (e.g., voltage, current, or other operational measurement data of the associated battery module 104, 106) can thus be transferred to the associated wireless communication transceiver 112, 114. The wireless communication transceivers 112, 114 are responsible for accepting data from the associated CMC 108, 110 and routing the information to the battery controller 160 by a reliable and secure wireless communication method via the wireless communication transceiver 150 of the battery system controller 160. In some embodiments, reliability and security may be handled by a single standard such as IEEE 802.15.4.E or IEEE 802.15.4-2015, or cobbled together using other techniques. In various embodiments, reliability is ensured by providing two or more physical or spatial communication paths for information flow (e.g., so that information transfer is not interrupted even in the event that one of the communication paths is unreliable); by providing two or more frequencies (or communication channels) for information flow (e.g., so that information transfer is not interrupted even in the event that one of the communication channels is unreliable); by locally buffering information in the wireless communication transceiver 112 or 114 so that information that is temporarily blocked (e.g., information that is transmitted on a defective communication path or channel, or information that otherwise does not reach the battery system controller 160) is not lost, but is instead temporarily saved in a memory for re-transmission at a later time; and/or by using a communication standard that includes message acknowledgement so that a wireless communication transceiver 112, 114 is aware when data has made it to the destination and the corresponding information may be deleted from a local memory or buffer, or when data has not arrived to its destination and needs to be retransmitted. In some embodiments, the communication channel or communication path is not fixed between a wireless communication transceiver 112, 114 and the battery system controller 160, and may instead change throughout time according to an algorithm such that different communication channels or paths can be used to communicate information between wireless communication transceivers 112, 114 and the battery system controller 160. In some embodiments, all available channels and paths are used.

By way of example, communication between the wireless communication transceiver 112, 114 and the battery system controller 160 can be provided across a wireless mesh network. In particular, the wireless communication transceivers 112, 114 of different battery module assemblies 116 may form a mesh communication network providing communication links between the wireless communication transceiver 112, 114 of assemblies 116 and the wireless communication transceiver 150 of the battery system controller 160.

Figure 2:
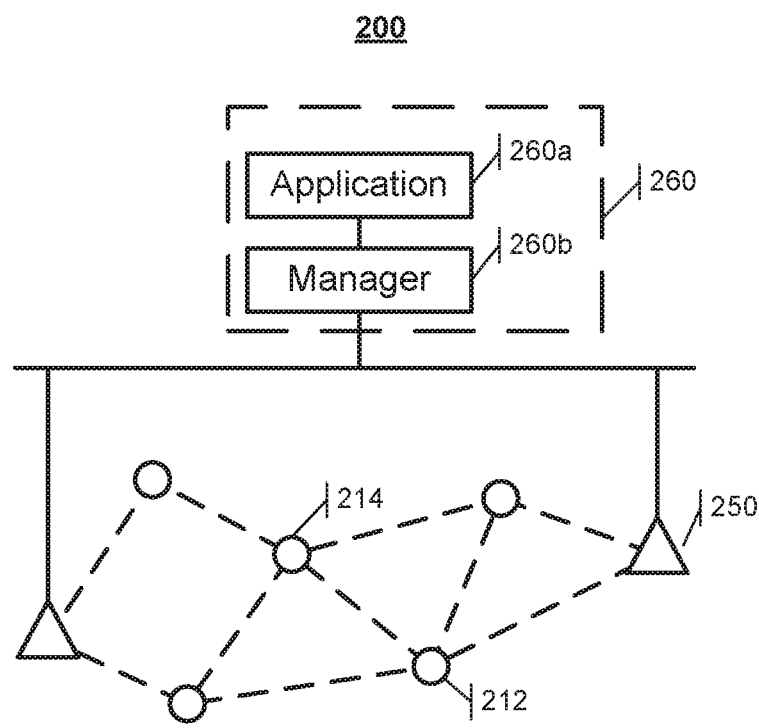
FIG. 2 is a high-level functional block diagram of a wireless mesh communication network as may be formed by wireless communication transceivers of a battery system like that shown in FIG. 1A.
Figure 3A:
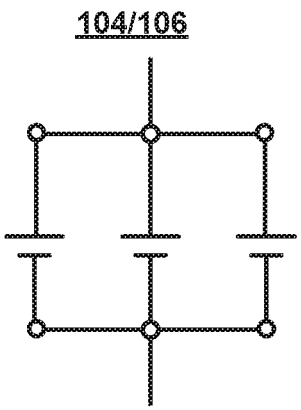
FIGS. 3A-3D are high-level functional block diagrams of battery modules including pluralities of battery cells as may be utilized in a battery system like that shown in FIG. 1A.
Figure 3B:
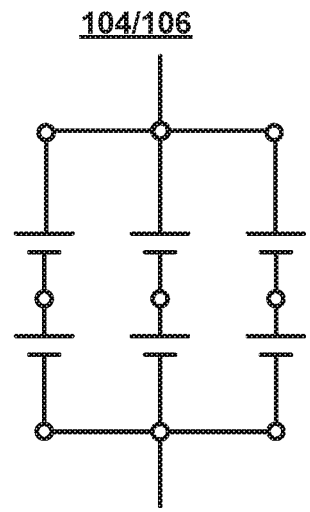
Figure 3C:
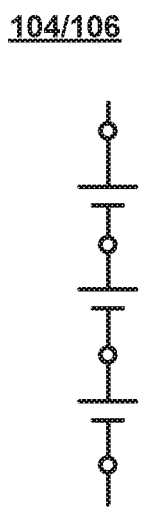
Figure 3D:
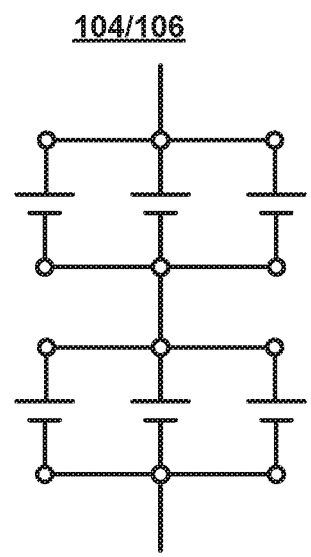

An illustrative example of a mesh network that can be used to provide wireless communication links between the wireless communication transceivers 112, 114, and 150 is shown in FIG. 2. Further examples of mesh networks are described in U.S. Patent Application Publications No. 2016/0345317 and No. 2015/0042389, which are hereby incorporated by reference in their entireties. FIG. 2 shows an example of an illustrative wireless mesh network 200. The wireless mesh network 200 enables the collection of cell measurement data from multiple CMCs or sense points at which wireless communication transceivers 212, 214, are located. Transceiver 212 and 214 may be substantially the same as transceivers 112 and 114 of FIG. 1A. The wireless mesh network 200 establishes a multi-hop communication link mesh between the wireless communication transceivers 212, 214 associated with CMCs (e.g., 108, 110) and the wireless communication transceiver 250 of a battery system controller 260 by using other CMC's wireless communication transceivers 212, 214 as communication relay points. The wireless communication transceiver 250 of the battery system controller 260 may function as an access point of the mesh network 200.

Data sent from distant wireless communication transceivers (WCTs) 212, 214 functioning as network nodes is automatically routed through the mesh by having each WCT 212, 214, and/or 250, functioning as a network node or network access point, transmit its packets topologically closer to the destination, and retransmit packets received from other nodes or access points closer to the destination. Each transmission and reception of a packet is called a hop, and in general different data packets will take different multi-hop routes through the mesh network. Typically, the multi-hop route taken by a packet (e.g., a data packet) through the mesh to its destination is dependent on stability of paths (e.g., stability of links between pairs of nodes and/or access points) in the wireless mesh network 200 and on the network's communication schedule (e.g., a communication schedule assigning timeslots and communication channels to nodes and access points of the network and specifying each network node and access point's next communication opportunity).

Reliability and Security of Wireless Battery System Monitoring:

By the process outlined above, packets can be communicated from a network node (e.g., a CMC 108, 110) to a destination (e.g., the battery system controller 260) or in the opposite direction to a network node (e.g., from the battery system controller 260). For example, cell measurement data may be collected in network nodes and transmitted through the wireless mesh network 200 in packets originating in wireless communication transceivers of CMCs. Additionally, application and control data (or other types of data) can be sent out towards the network nodes (e.g., CMCs) from, for example, the battery system controller 260 or another network node. In some embodiments, reception of each packet transmission is acknowledged at each hop through the network to create an extremely reliable end to end system, typically to 99.999% reliability. In such embodiments, each transmission of a packet between a transmitter and a receiver (e.g., between two nodes, between two access points, or between a node and an access point) includes transmission of the packet by the transmitter, reception of the packet by the receiver, and transmission of an acknowledgement of receipt of the packet from the receiver to the transmitter upon successful reception of the packet by the receiver. In such embodiments, if no acknowledgement of receipt is received by a transmitter, the transmitter may retransmit the packet on the same link (e.g., on the same frequency, and to the same receiver) or on a different link (e.g., on a different frequency, and/or to a different receiver) of the wireless mesh network 200 until an acknowledgement is received.

For example, in accordance with the principles described above, the monitoring or controlling of a battery system with a series connection of battery modules can include steps for measuring a first parameter (e.g., voltage, current, temperature, or the like) of a first battery module in the series stack of battery modules, wirelessly transmitting the first parameter to a first receiver on a first channel, receiving an acknowledgement that the information of the first parameter has been received, and, in the event of not receiving an acknowledgement of reception, performing a re-transmission of the parameter, wherein the re-transmission of the parameter is performed on a second channel and/or to a second receiver. The time between the transmission of the first parameter and the re-transmission is preferably shorter than a rate required by a quality-of-service metric, so that even if a particular communication link is unreliable, there exists a sufficient amount of time for at least one re-transmission while maintaining (or otherwise not negatively impacting) the quality-of-service metric. In various examples, at least one of spatial, time, and channel (e.g., transmission frequency) diversity provides a transport mechanism for the first parameter to the first receiver of the battery controller that has a reliability greater than without said diversity. In various other examples, the wireless transmission is one of: near-field RF, far-field RF, magnetic, acoustic, or infra-red; each wireless transmission is acknowledged by the intended receiver; and/or the re-transmission is performed only on a portion of the WCT traffic.

The wireless mesh network 200 can include a centralized network manager 260b. The network manager 260b is responsible for controlling operation of the wireless mesh network 200. For example, the network manager 260b may establish and control network timing (e.g., by setting a network clock according to which all nodes in the network communicate with each other). The network manager 260b may also determine which devices (e.g., nodes and access points) can participate in the network by selectively joining nodes and access points to the network, assigning network addresses (or other unique identifiers (ID)) to the joined devices, and setting the communication schedule for the network by assigning bandwidth to different devices of the network. The communication schedule may assign pairs of timeslots and channels to the devices (e.g., wireless nodes 212, 214 and APs 250) of the network, to thereby identify which device can communicate on each channel during each timeslot of the network clock. Additionally, the communication schedule may assign pairs of timeslots and channels that form a "join listen" bandwidth during which wireless nodes seeking to join the network can send network join messages, and during which wireless nodes already joined to the network listen for such network join messages. In this manner, the communication schedule includes bandwidth assigned to (or allocated for) wireless nodes that are joined to the wireless mesh network, and bandwidth assigned to (or allocated for) nodes that are not currently joined to the wireless mesh network. The network manager 260b can form part of a battery system controller 260 in some embodiments.

In some embodiments a network manager is not used; instead, a pre-determined communication schedule is applied to the nodes.

The wireless mesh sensor network 200 also includes one or more Access Points (APs) 250 which are devices that bridge the wireless network and a wired interface. The APs 250 can receive packets wirelessly from the nodes 212, 214 of the wireless network, and can send these received packets over a wired network to the manager 260b. More generally, the APs 250 provide an interface between the wireless mesh sensor network 200 and a battery system controller 260. As such, APs 250 may receive wireless packets from the wireless nodes and send these packets to the manager 260b or various applications 260a executed by the battery system controller 260. The APs 250 may also receive packets from the manager 260b or applications 260a, and forward these packets through the wireless mesh network 200 to destination wireless nodes 212, 214.

While an illustrative wireless mesh network has been described in relation to FIG. 2 as a type of network that may provide wireless communication connectivity between the wireless communication transceivers 112, 114 and the battery system controller 160 in the battery system 100 under consideration, other wireless network topologies can alternatively be used. Further characteristics of the wireless networks providing communication capabilities in the battery system 100 are described in detail below.

To ensure that information communication within the battery system 100 is not compromised, security of the wireless communication is provided by employing an encryption technique to encrypt wireless communication between WCTs 112, 114 and the battery system controller 160 from external eavesdropping or control. For this purpose, each WCT 112, 114 includes a processor configured to encrypt measurement data received from the associated CMC prior to transmitting the data across a wireless communication link. The processor is further configured to decrypt data and control instructions received by the WCT from the battery system controller 160. To provide the encryption functionality, the WCTs and the battery system controller 160 store encryption and decryption keys. Various encryption modalities can be used including private key encryption; public key encryption; a number used only once (nonce) such as a join counter to prevent replay attacks; a unique identifier to provide access control to each WCT; a network identifier (ID) or battery system identifier (ID) to allow for multiple battery systems to operate within the same radio space as distinct entities; message authentication; or, generation of a random seed for a security key using a thermal-noise source.

The WCTs 112, 114, the battery system controller 160, and the WCT 150 of the battery system controller 160 may operate synchronously using a shared time reference or asynchronously using individual and non-synchronized clocks. In situations in which the transceivers operate synchronously, clocks in each of the transceivers may be synchronized with each other through wireless communication between the transceivers. For example, all transceivers of individual WCTs 112, 114 may be synchronized to a master clock of the WCT 150 or of the battery system controller 160 based on timing information transmitted by the WCT 150 to the wireless network. The common clock or sense of local time can then be used to improve authentication security. In such situations, the network of WCTs includes a common clock or sense of time synchronized using packet exchanges and timing measurements applied to wireless transactions between first and second WCTs. After the WCTs have synchronized their clocks, for example upon final assembly of the battery system 100, the common sense of time is maintained between the WCTs to within a timing error. In a situation in which one WCT stops communication with another WCT, for example because the one WCT is reset, the WCT was moved from radio range, or any other applicable reason, the one WCT will try to rejoin the communication link or network with the other WCT once possible (e.g., following the reset, once back in radio range, or the like). The common sense of time between the one WCT and the other WCT is maintained within the timing error and diverges over time according to a frequency mismatch between the two local clocks within the WCTs. Thus, with knowledge of the timing error and the bounded clock drift, a time-varying security parameter can be calculated for use to enhance security. For example, the one WCT may send its local sense of time to the other WCT in a security handshake; if the local sense of time from the one WCT differs from the local sense of time from the other WCT by more than a threshold, the second WCT can then be denied security credentials and prevented from joining the network. In some systems, a sense of time mismatch as described above is used in conjunction with other security techniques such as a nonce, or encrypted communication.

In some embodiments, security of the battery system 100 is enhanced by monitoring the connectivity of a mesh network formed between WCTs within the battery system 100. Individual WCTs may keep track of loss of connectivity to the battery system controller 160, delay in connectivity, disconnection from the network, or resetting of the network. The WCTs may wirelessly relay this information to the battery system controller 160.

In some embodiments, security of the battery system 100 is enhanced by configuring the battery system controller 160 to provide a response to one or more denied attempts to join the mesh network established between the WCTs. In such a situation, the battery system 100 is fully assembled and operating normally with the WCTs communicating to the battery controller 160 through a wireless network (e.g., a wireless mesh network 200). In the event that an interloping WCT attempts to breach the security of the network (e.g., 200) by attempting to join the network so that the interloping WCT can send corrupt data to the battery system controller 160 (e.g., for nefarious purposes), a first network join attempt is performed by the interloping WCT using a security credential that is invalid. For example, an incorrect security key, an incorrect nonce, a media access control (MAC) identifier (MACID) that is not on an access control list, or an invalid message integrity code (MIC) or cyclic redundancy check (CRC) may be used in the first join attempt. A join request including the security credential can be transmitted by the interloping WCT to the network and, in response to receiving the join request, a network element (e.g., a network WCT having received the join request, or the network manager (e.g., 260*b*)) processes the request and denies the request on the basis of the invalid security credential. Additionally, upon determining that the join attempt should be denied, the WCT that received the join request from the interloping WCT performs an action of: incrementing a counter keeping track of failed join attempts; and/or, sending a message to the battery system controller 160 reporting the failed join attempt. The battery system controller 160 collects reports of failed join attempts and, according to a predetermined algorithm, takes a security response when a number of failed join attempts (or a rate at which failed join attempts are determined) exceeds a threshold. The security response taken by the battery system controller 160 can include disabling the battery system 100, disabling a portion of the battery system (e.g., one or more battery modules or battery module assemblies), alerting an operator of the battery that a security attack has been attempted; sending a message to a central data-warehousing repository where failed security attempts are logged; disabling the joining of new WCTs to the network; or the like.

The security of the battery system 100 can be enhanced by monitoring the connectivity of a mesh network (e.g., 200) formed between WCTs within the battery system 100 for a security indicator and taking a security response in the event that a security indicator is asserted. For example, a security indicator may include a loss of connectivity or mesh-reform events after final assembly of the battery system; the response may be to place the battery system in a fail-safe mode or perform a check of the battery integrity through electrical measurements.

To provide a dependable source of electrical power, the battery system 100 is preferably designed to have a high level of reliability. As part of providing dependable operation, the communication between components of the battery system 100 is important. Indeed, communication reliability can be a critical component of a battery system since lack of monitoring information can require issuance of a preemptive safety fault resulting in a shutdown of the battery system and significant end user impact. Reliability is even more important when there are large numbers of CMCs/WCTs in a large battery system 100. Wireless communication may be performed using radio-frequency (RF) communication techniques such as a single-channel protocol like Zigbee, Bluetooth, ultra-wideband (UWB) communications, near filed communication (NFC), or IEEE 802.11.X. In some embodiments, where the mechanical assembly of the battery system provides for an optical path for communication, the wireless communication method is infra-red transmission and reception using a photo-diode or photo-transistor; in such examples, the mechanical assembly has a finish that is compatible with reflecting light inside the battery housing to allow an optical communication link to be established. In some embodiments, the mechanical assembly of the battery system is a metal container, opaque to infra-red, with a transparent window to allow IR radiation to flow into and out of the housing. In some embodiments where the battery module assemblies are rigidly attached to a frame, thereby allowing acoustic propagation, the wireless communication method is ultrasonic.

As noted above, the combination of a battery module including one or more battery cells, a CMC, and a WCT forms a battery module assembly 116. The battery module assembly has a positive terminal and a negative terminal used to couple to other battery module assemblies in a series stack of battery modules in the battery system 100. The voltage difference between the terminals of a battery module 104, 106 (or battery module assembly 116) is in a range suitable for the operation and the measurement voltage range of the CMC circuits 108, 110.

While FIG. 1A illustratively shows each battery module 104, 106 as a single battery cell, more generally a battery module 104, 106 can include one or more battery cells connected in parallel and/or series with each other. For example, FIGS. 3A-3D show various illustrative battery cell configurations which may be included within a battery module (e.g., 104, 106). In the figures, the circles represent potential locations for voltage and/or current measurement by the CMC in each battery module. In some embodiments, multiple node voltages and/or currents within the battery module are measured by the CMC. Each of the configurations of battery cells of the illustrative battery modules shown in FIGS. 3A-3D provides increased battery energy output as compared to a battery module including only a single cell alone. Each battery cell configuration further has a voltage range suitable for and compatible with operating voltage ranges of commercially-produced CMCs and components thereof. The battery cells may have a lithium polymer chemistry, for example.

In various embodiments, the CMC and the wireless communication transceiver (WCT) associated with a same battery module are co-located on the same circuit board, are co-located on a single semiconductor substrate (e.g., a single-chip solution), or are packaged in a hybrid module such as a low temperature co-fired ceramic (LTCC) module, a micro-module, a system-in-package, or other similar system. In some embodiments, the electrical power for powering operation of each CMC and/or the WCT is taken from one or more of the battery cells being monitored and/or controlled by the CMC. For example, the CMC and WCT may be powered by electrical power from across the terminals of the battery module they are monitoring. Alternatively, the CMCs and WCTs can be powered through a separate power bus, through energy harvesting of ambient energy (harvesting of thermal, vibration, RF, EMI, or other power), or through a dedicated power supply (e.g., a coin cell battery).

Figure 1C:
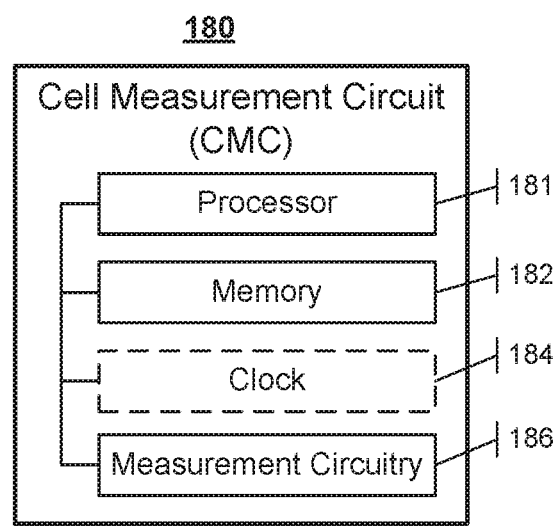
FIG. 1C is a high-level functional block diagram of a CMC as may be used in a battery system like that shown in FIG. 1A.

FIG. 1C shows an example of a cell measurement circuit (CMC) 180 that may function as one of CMCs 108 or 110 of FIG. 1A. The CMC 180 can include a processor 181, memory 182 (e.g., a volatile memory and/or nonvolatile memory) and, optionally, a clock 184. The memory 182 stores application programs and instructions for controlling operation of the CMC 180 in the various manners described throughout this description, and the processor 181 is configured to execute the application programs and instructions stored in the memory 182. The clock 184 (e.g., a frequency reference) is used to control timing of operation by the processor 181. In some examples, the clock 184 is shared with the associated WCT and in such examples the clock may be located in the CMC 180 or in the associated WCT (e.g., clock 176).

In some embodiments, certain functional elements are shared between the WCTs (e.g., 170) and the CMCs (e.g., 180). For example, a same processor may control operation of both a WCT and the corresponding CMC; a memory can be shared between the WCT and CMC, for example to enable the CMC to store measurement data in the memory and enable the WCT to retrieve the measurement data from the memory for transmission across a wireless communication link. Other functional blocks, for example multipliers, clocks, registers, busses, memories, can be shared between a CMC and the corresponding WCT.

As shown in FIG. 1C, the CMC 180 further includes measurement circuitry 186, which may include circuitry used to measure a voltage between nodes of an associated battery module or a current flowing through the associated battery module. In certain embodiments, the measurement circuitry 186 can additionally or alternatively be used to measure impedance or reactance of circuit components. The measurement circuitry 186 is communicatively coupled to the processor to enable the processor to obtain measurement data therefrom; in various examples, an analog to digital converter (ADC) is used to convert an analog measurement of the measurement circuitry into a digital output provided to the processor 181. The measurement circuitry 186 can function under the control of the processor 181 and, in some examples, may perform a measurement in response to a trigger signal received from the processor 181.

FIGS. 1D-1H show various implementations of measurement circuitry 186 that may be used in different cell measurement circuits. The measurement circuits shown in FIGS. 1D-1H are illustrative, and other measurement circuits can also be used in accordance with the principles of this disclosure.

In FIG. 1D, illustrative measurement circuitry includes an ADC, such as a successive approximation register (SAR), a delta sigma ADC, a flash ADC, or other single-ended ADC, that is coupled between two nodes 191 and 192 of a battery module (e.g., battery module 104 or 106 of FIG. 1A). The ADC may be coupled between upper and lower terminals of the battery module or, alternatively, between internal nodes of the battery module. The measurement circuitry includes a voltage reference 193 provided to the ADC. In operation, the ADC samples the voltage at its input terminals 191 and 192, converts the voltage with respect to the reference 193, and outputs a digital signal 194 (e.g., a multi-bit digital signal). The digital signal 194 is provided to the processor 181 of the CMC 180 for communication to the associated WCT 170, or is communicated directly to the associated WCT 170. In various embodiments, the reference 193 may be internal to the ADC or a discrete component (as shown).

In FIG. 1E, the illustrative measurement circuitry measures a voltage across a resistive element (e.g., a resistor 195, as shown, or a parasitic wiring resistance or other resistive element) located in a current path of the battery module. For example, the resistive element may be series-connected to the battery module (as shown), or located in a current path internal to the battery module. The ADC, which may be an SAR ADC, a delta sigma ADC, a flash ADC, or the like, samples the voltage across the terminals of the resistive element and, in combination with a reference (internal to the ADC, or external thereto such as shown in FIG. 1D), provides a digital output measurement. The digital output measurement is indicative of the amplitude of the current flowing through the resistive element, and is communicated to the associated WCT 170.

FIG. 1F shows an illustrative measurement circuit in which a differential-ended ADC, such as a SAR ADC, a delta sigma ADC, a flash ADC, or the like, is coupled between battery modules. In some embodiments, a reference (e.g., 193) is further provided. The ADC samples the voltage at its input terminals, and converts the voltage to a digital value. The digital measurement value is communicated to the WCT (e.g., 170).

FIG. 1G shows a further illustrative measurement circuit in which a single-ended or differential ADC is used. The ADC is coupled to the associated battery module through a filter shown, for illustrative purposes, as a low-pass filter including a resistor and capacitor. Other filters could alternatively be used. The ADC thus receives at its input a filtered version of a signal in the battery module. The ADC samples the voltage at its input terminals, converts the voltage to a digital measurement signal, and communicates the digital measurement to the WCT (e.g., 170). In some embodiments, signal conditioning provided by the filter confers low-pass filtering (as shown); in other embodiments, alternative filter circuits can be used to provide anti-aliasing filter functionality, RMS (root mean square) detection, high-pass filtering, thresholding, or other appropriate signal conditioning. In some embodiments the signal conditioning includes active devices while in other embodiments (such as that shown in FIG. 1G for illustrative purposes) only passive devices are used.

In FIG. 1H, an illustrative measurement circuit includes a varactor 196 (e.g., a variable capacitor) coupled between the battery module, and an oscillator 197 having a frequency that is responsive to the capacitance of the varactor 196. The capacitor of the varactor 196 is responsive to the voltage across the battery module. A counter is coupled to the oscillator 197 and counts the number of cycles of the oscillator output signal occurring during a known length of time using, for example, a timer connected to a network clock (or other time reference). The count output by the counter is provided to the WCT (e.g., 170) and is indicative of a voltage associated with the battery module.

Communication between a battery module's WCT 112, 114 and the battery system controller 160 is performed wirelessly. The battery system controller 160 includes a WCT 150 coupled to the battery system controller 160 and through which the information from the CMCs is received. Depending on the wireless communication modality used, the WCT 150 may have an antenna, photodiode, acoustic transducer, or other receiving or transmitting element. The receiving/transmitting element of the WCT 150 may be located within battery system housing, or the receiving/transmitting element may be located outside the battery system housing and may communicate with other WCTs located inside the housing (e.g., WCTs 112, 114) using the non-ideal isolation properties of the battery system housing (e.g., RF leakage, acoustic coupling, or the like). The battery system controller 160 includes a processor, a memory, and a non-volatile memory, and processes the information received from the CMCs 108, 110 to control the charging, discharging, load-balancing, cooling, or safety function of the battery system 100.

In some embodiments, the use of a mesh network for communication between WCTs inside the battery housing provides for reliable communications by compensating for time- and spatially-varying RF propagation characteristics within the battery housing. In this regard, communications in an enclosed environment such as a battery system housing have differences from many other communication systems, including partial shielding from external EM-radiation and multipath propagation. Partial shielding of the WCTs occurs when the WCTs are enclosed in a RF-opaque container such as common battery system housings. The partial shielding provides some resistance to external interference such as spoofing and eavesdropping on wireless communications. However, the quality of the shielding provided by the housing is dependent on the frequency of the RF signals as well as how well the housing approximates a Faraday cage. In this respect, any openings in the housing, including openings for bulkhead connectors, allow a path for wireless signals to propagate into and out of the housing. Shielding is generally considered for any wireless communication link where two WCTs must be able to communicate with each other. In some embodiments, the WCTs use low-frequency magnetic communications which have improved propagation properties in cluttered environments where the communications occur in the near-field electromagnetic (EM) propagation domain, as well as have better propagation properties through metal objects. In other embodiments, the WCTs use the industrial, scientific, and medical radio band (ISM band) or a radio frequency having a wavelength less than a dimension of the battery housing.

In implementations in which the WCT uses a higher frequency RF signal, such that the RF signal propagates internal to the battery system housing in the far-field domain, the battery system housing can act as a radio frequency mirror to reflect transmitted signals many times off the interior walls of the housing. The reflections can cause multipath fading as well as inter-symbol-interference (ISI). Multipath fading results in some locations within the battery system housing having the received RF power drop to zero or close to zero due to deconstructive interference between reflected signals. At these locations, certain communication links may be unattainable, unreliable, or of poor quality. In such situations, the choice of a different channel is often sufficient to avoid the multipath null since the location of the null depends on the geometry of the housing and the particular frequency being transmitted. However, since the mechanical dimensions of the battery system housing change over temperature and with vibration (as well as with any other deformation of the container), the channel that works at one instant in time in one location is not guaranteed to work for all instances in time at the one location. Thus, in some embodiments, the WCTs use channel hopping to provide for robustness to multipath fading and account for time-varying channel impulse response behaviors. In some embodiments, the channel hopping is performed at a rate faster than a required rate defined by a quality-of-service (QOS) metric so that if a particular channel is unreliable, there remains a sufficient amount of time to attempt transmission on one or more other channels prior to reaching the end of a response time period defined by the QOS metric. For example, a QOS metric may include a requirement that the battery system controller 160 receive voltage and/or temperature status from each CMC (or each battery module assembly) at least once every 5 seconds. In the example, to ensure that the QOS metric is met, over-provisioning is used to ensure that multiple data transmission opportunities (including transmission opportunities on different channels or frequencies) are provided within the 5 second time period, for instance by providing updated measurement data from each CMC to the battery system controller 160 every 1 second. In some embodiments, the interior of the battery housing is painted with an RF absorbing paint, foam, or any other appropriate material to absorb some portion of RF energy incident on the housing and thereby minimize the amount of multipath propagation. In some embodiments, spatial diversity is used to compensate for RF propagation deficiencies within the housing by allowing mesh routing of information to provide multiple different routes to the desired destination through other WCTs within the housing.

In some embodiments, the multipath propagation within the battery system housing has properties that cause inter-symbol interference (ISI). For instance, ISI may occur because the spread-in-time of the multipath-channel impulse-response is on the order of (or more than) the bit period of the RF signal. To attenuate the effects of ISI, various means may be undertaken including i) painting, or otherwise applying to, the inside of the housing with an RF absorbent material, ii) communicating at a lower data rate, iii) using an equalizer within the radio link to compensate for the non-ideal channel response, and/or iv) using a modulation technique less susceptible to ISI, such as orthogonal frequency-division multiplexing (OFDM), for example, or ultra-wideband communication techniques.

Determining Positions of Battery Modules within a Battery System:

As described above, the battery system 100 can include a large number of battery modules connected in a series stack between the terminals 101 and 102. In turn, each battery module 104, 106 is connected to an associated CMC 108, 110 and WCT 112, 114 configured to measure and wirelessly transmit a voltage, current, or other characteristic of the battery module. In some examples, the WCT and CMC may further be configured to wirelessly receive a measurement or control command from the battery system controller, and to control the operation of the CMC or associated battery module in accordance with the received command. In both instances, it may be desirable to know the position of a given battery module (or CMC or WCT associated with the battery module) in the series stack between the terminals 101 and 102. For example, the position information may be used in the identification or diagnosis of a battery system fault, or in the shutting down operation of a portion of the battery system.

In order to determine the position of each battery module in the series stack between the terminals 101 and 102, and to identify the CMC and WCT associated with each determined battery module, substantial effort may be required. For example, in order to perform such determinations manually, a catalog of each battery module, CMC, and WCT would need to be performed during manufacture and assembly of the battery system 100, and each CMC and/or WCT would need a unique identifier to be recorded during the cataloging for future reference. A more efficient approach to determine relative positions of battery modules in the series stack is thus provided in accordance with the system and methods described below.

In accordance with a first approach for determining the relative positions of battery modules 108, 110 in the series stack between the terminals 101 and 102, precise time synchronization between the CMCs and/or WCTs is provided. In particular, a first WCT (e.g., 112) is synchronized to a second WCT (e.g., 114) using wireless transactions to synchronize the WCTs' internal clocks with high accuracy. For example, the first and second WCTs may be synchronized to within 100 µs of each other; in another example, the WCTs may be synchronized to within 1 µs, 100 ns, or 1 ns of each other. Once two or more WCTs are accurately synchronized, the synchronized clocks can be used to trigger the associated CMCs to perform additional measurements and/or control using the improved sense of time. In this way, two or more battery modules can have a parameter (e.g., voltage, current, or other) measured synchronously by their respective CMCs. The CMCs can thus be configured to repeatedly and synchronously sample the respective battery modules (e.g., sensing an output voltage of the battery modules through use of an ADC). In turn, the synchronously captured samples are communicated wirelessly to the battery system controller 160 where post-sampling analysis is performed. In one example, the post-sampling analysis includes computing a cross-correlation (or other appropriate signal processing operations) between the synchronously captured samples to determine the relative timing of occurrence of an artifact in the measurement between the samples. The order of the battery modules in the series stack can then be determined based on the determined relative timing information. Specifically, the delay in timing of the artifact in samples from two different CMCs increases with the distance between the associated battery modules in the series stack. As such, the relative proximity of battery modules can be determined according to the relative proximity in timing of the artifact in samples from different battery modules. Numerous samples can be taken to improve the accuracy of the relative position determination in spite of noise and to improve the resolution of timing in a fashion that is similar to a sampling oscilloscope. Further, assuming the ADC sampling switch is fast and well behaved, the voltages measured by the ADC may be synchronized in time to well less than 1 ns in a relatively straightforward manner. Note that an artifact, as used herein, refers to a change in voltage, change in current, or change in other measured parameter that propagates through the series stack of battery modules. An artifact may occur, for example, in response to a sudden change in load applied across the terminals 101 and 102 or a sudden change in power applied across the terminals 101 and 102 (e.g., a change in a power signal applied by a charger providing charging power to the battery system 100).

In accordance with the various methods described above, the relative electrical position of a battery module in a series stack of battery modules can be determined by performing steps of measuring a first parameter of a first battery module the first parameter being sensitive to a position in a series stack of battery modules, and wirelessly transmitting the first parameter to a first receiver. A second parameter of a second battery module is measured, the second parameter being sensitive to a position in the series stack of battery modules. The second parameter is wirelessly transmitted to a second receiver. The first and the second received parameters are processed to provide a determination of a relative module-position in the series stack. In some examples, the measurement of the first and second parameters comprises measurements of a plurality of synchronized ADC samples; the measurement of each of the first and second parameters comprises measurement of a value indicative of a common-mode voltage relative to a chassis; the measurement of each of the first and second parameters comprises measurement of a value indicative of a received signal strength for a signal at least a part of which is conducted through a battery conductor; the first and second receivers are the same receiver; and/or the first and second receivers are part of a mesh network and at least one of the first or second receiver relays the received message to a third receiver.

The above-described techniques can be used to determine the relative order or positions of battery modules in the series stack of battery modules in the battery system 100. More generally, however similar methods can be used to determine the positions of battery modules in parallel (e.g., in the arrangement shown in FIG. 3A, or one of the arrangements shown in FIGS. 3B and 3D). In this regard, modules coupled in parallel with each other may show the measurement artifact at nearly the same time. Using the control function provided by individual CMCs, the locations of battery modules in different parallel branches can be determined. In detail, the control function can be used to cause a CMC to disconnect the corresponding battery module, bypass the battery module or a battery cell thereof, or adjust loading on a battery module or cell. Measurement differences between having the control function on and off (e.g., the corresponding battery module or cell disconnected) can be used to determine where a battery module or cell is located within the battery system. For example, if one parallel branch is electrically disconnect using a control command, then all modules or cells in that branch would not exhibit a normal response to an artifact. The same technique can also determine module or cell location in series. For example, if a module or cell is bypassed using a control command function, then that module or cell would not exhibit normal response to an artifact.

To provide precise timing synchronization between local clocks in different WCTs, a bidirectional message transaction can be used between two (or more) WCTs. In particular, timing information may be sent by synchronizing the transmission of a data bit with a local clock on the transmitter and storing or transmitting the value of the clock at the point of synchronization. Timing information may be received by estimating a time of arrival by one or more of i) averaging a signal in a clock-recovery loop operating on un-recovered data, wherein the signal is representative of a phase of the received data bits to provide a metric of time-of-reception or ii) using I/Q-constellation de-rotation information (i.e. phase, frequency, or a combination thereof) from a data-recovery system used to process baseband signals to provide an estimate of the time of reception of a packet to a more precise quantity than would be possible without using the de-rotation information, or iii) any other appropriate means of measuring a time of reception.

For example, under the assumption that two WCTs N1 and N2 have a relative (timekeeping) frequency difference of dF (e.g., the clocks of the two WCTs differ in frequency by dF). In some embodiments, a clock used for timekeeping is also used to provide a reference for a local oscillator used in radio reception, transmission, or both. If the two nodes were co-located (i.e. there was no propagation time delay between the nodes), then one would expect to see a time error of dF*tT where tT is a length of an effective time period during which the frequency difference is being integrated into time error, and is a function of the packet length and the time between packet transactions. Initially, packets are transmitted from WCT N2 to WCT N1, each packet being transmitted with a timestamp of departure (according to the local clock of N2) and a timestamp of reception (according to the local clock of N1). Next, the opposite messaging direction is used such that packets are transmitted from WCT N1 to WCT N2, each packet being transmitted with a timestamp of departure (according to the local clock of N1) and a timestamp of reception (according to the local clock of N2). Since the roles here have been reversed, the timing error caused by the frequency difference switches sign to −dF*tT. Thus, the average of the measurements in the opposite directions is thus zero indicating zero distance between the WCTs. However, if the devices are spatially separated, there will be a propagation time associated with both directions, which will not be canceled. The propagation time can thus be measured from these two transactions by computing the average of the samples. In turn, the determined propagation time is used to adjust the relative timing of the two WCTs' clocks so as to synchronize the local sense of time (i.e., clocks) at one or both WCTs by compensating for the RF signal propagation time. In this way, the clocks of WCTs N1 and N2 are brought into better synchronization despite being in different locations and despite being in a multipath environment.

For example, as shown in FIG. 4, a first packet P1 is transmitted from WCT N1 to WCT N2 at time $t_{P1\_tC1}$ (P1: packet 1; t: transmit; C1: timestamp according to clock C1 of node N1). The first packet is received at WCT N2 at time $t_{P1\_rC2}$ (P1: packet 1; r: receive; C2: timestamp according to clock C2 of node N2). Similarly, a second packet P1 is transmitted and received, and is associated with timestamps $t_{P2\_tC1}$ and $t_{P2\_rC2}$. In the reverse direction, third and fourth packets are transmitted from WCT N2 and received at WCT N1, and have associated timestamps $t_{P3\_tC2}$, $t_{P3\_rC1}$, $t_{P4\_tC2}$, and $t_{P4\_rC1}$. The propagation time (pt) is determined by averaging the difference between the sample times: pt=avg $(t_{Px\_rC?}-t_{Px\_tC?})$ for all packets x, where an equal number of packets has been transmitted in both directions (N1→N2, and N2→N1). Note that the notation C? indicates that the average computation is performed regardless of which clock (C1, C2) was used to make the timestamp by subtracting the transmit timestamp from the receive timestamp for each packet. Once the propagation time (pt) is known, if $t_{P1\_rC2}-t_{P1\_tC1} \neq$ pt, the clocks C1 and C2 are misaligned. One of the clocks can thus be adjusted by an amount equal to $(t_{P1\_rC2}-t_{P1\_tC1}-$ pt$)$ to bring the clocks into synchronization. The synchronization of the clocks detailed above and in FIG. 4 can thus be periodically repeated, pair-wise, between all WCTs in the battery system 100, to ensure that the clocks remain in synchrony over time.

We note here that techniques that help combat channel-impairments such as multipath fading and ISI will not, in general, provide improved timing resolution since these techniques are transparent to a pure propagation-time delay: time delay is unobservable using simply these techniques. In some embodiments, a round trip measurement is not performed since the required synchronization accuracy is less and a simple time-of-packet-reception measurement is sufficient. In some embodiments, a frequency tracking loop, a phase tracking loop, or a combination thereof is used to cause a clock of one WCT to track the time keeping properties of a clock of another WCT in response to measured timing and/or frequency deviations, for example as disclosed in U.S. Pat. No. 8,953,581, which is hereby incorporated by reference in its entirety. In various embodiments, timing information, including the time of reception of a packet, the time of transmission of a packet, or a turn-around time (e.g., as measured by a local clock or counter) between receiving and transmitting a packet, are included in the packet used to measure the time of RF propagation; in some embodiments, a separate packet is sent containing measurement results; in some embodiments, one or more of these pieces of information are stored locally.

Using the foregoing approach, the relative frequencies and timing between clocks of different WCTs can be accurately synchronized. Once that synchronization is established, the clocks can be used to cause the CMCs associated with the WCTs to synchronously sample the associated battery modules. In this regard, in general, the closer in time a sample is taken relative to a clock synchronization operation the less time for timing error to accumulate. For example, in some embodiments, a 5 GHz clock is available in each WCT to serve as the WCT's transceiver's local oscillator. Using this local oscillator, which is phase locked to a local frequency reference generated by a crystal oscillator, each CMC can generate an ADC-sample signal to sample the voltage difference across the associated battery module (or the current through a conductor carrying the battery module's working current) synchronously. In some embodiments, the ADC and the RF-synthesizer are located on the same integrated circuit to provide a low-power means of maintaining precise timing information. By performing multiple sampling operations synchronously in each of the battery modules and cross-correlating or otherwise comparing the measurements obtained in different battery modules, the system can determine which battery module is first in the stack (e.g., connected to one of terminals 101 or 102), and determine the order of the remaining battery modules in the stack, since the current will travel somewhat slower than the speed of light through the stack and the propagation of the current is measured using the precisely synchronized ADCs which can measure the current directly or a metric associated with the current such as a battery voltage.

We note that as long as the ADC sample operations are accurately synchronized in time, differences in the timing of the actual conversion performed in each CMC are less critical. Furthermore, a high-bandwidth ADC sampling front-end (or at least well matched) between various battery module assemblies in the stack is beneficial since mismatch in ADC group delay can appear as propagation delay in the signal of interest. If group delay variation between various ADCs (including any pre-ADC opamps/filters etc.) is non-negligible, this would add directly to timing error. This error may be corrected by determining group delay local to a particular ADC by synchronously injecting a known test signal to the ADC input, measuring the sampling delay, and compensating for this error in the final measurement. The timing information thus collected, or a processed version of the timing information, is used locally within the WCT or made available to the battery controller using wireless communication.

In accordance with a second approach for determining the relative positions of battery modules 108, 110 in the series stack between the terminals 101 and 102, the position of each battery module within the stack of battery modules is determined using an electric field sensor. For example, an electric-field (E-field) sensor can be used. In these situations, the electric field sensor senses an intensity of an electric field between a common node (e.g., a chassis ground common to all modules in the battery system) and a node local to the CMC. For example, an electric component having a voltage coefficient, such as a capacitor having a voltage coefficient, a high-voltage varactor, a field-controllable resistor (e.g., a metal electrode placed over a diffusion resistor separated by a dielectric), or a parasitic field transistor, are sensitive to electric fields. The relevant parameter (e.g., capacitance for a varactor or capacitor, resistance or conductance for the variable resistor or field transistor) is measured.

Figure 5A:
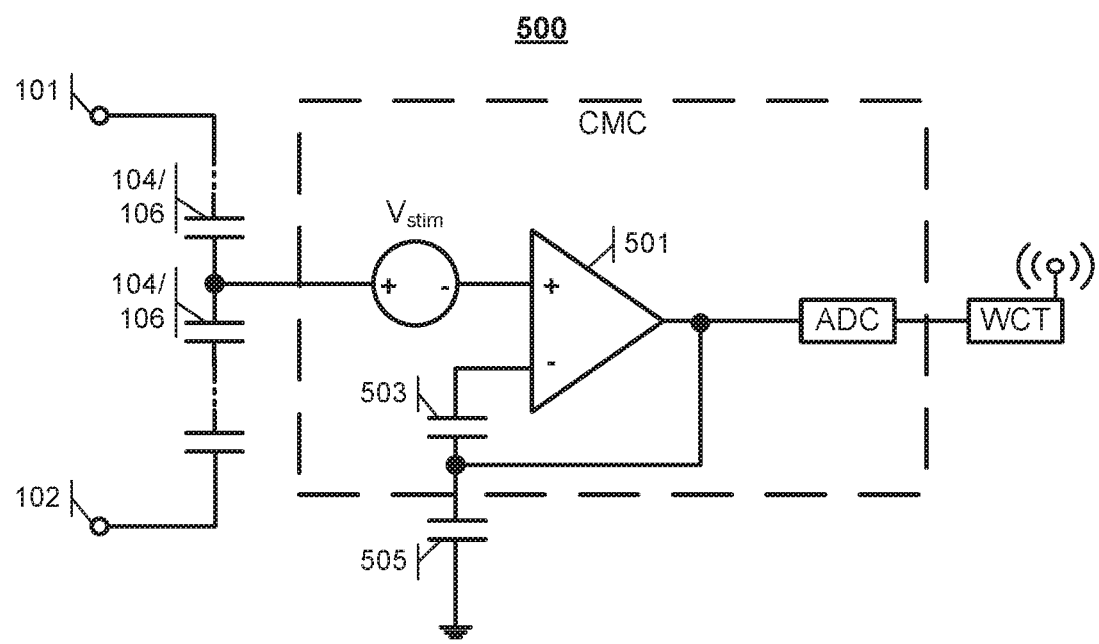
FIGS. 5A and 5B are high-level functional block diagrams showing components of cell measurement circuits (CMCs) as may be used in a battery system like that shown in FIG. 1A.
Figure 5B:
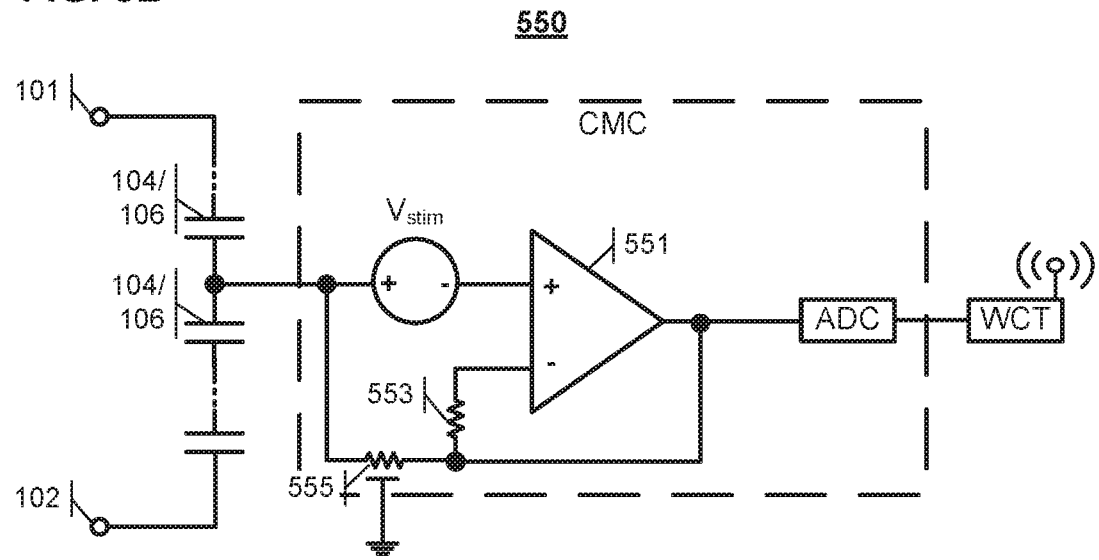

For example, as illustratively shown in FIGS. 5A and 5B, the electric circuit component having a non-zero voltage coefficient may be a capacitor 505, resistor 555, or other impedance or reactance element. The circuit component having a non-zero voltage coefficient indicates that an impedance or reactance of the circuit component varies with the voltage across the circuit component. The relevant parameter (e.g., impedance or reactance) of the electric component 505/555 having the voltage coefficient can be measured using an opamp circuit configured to use the element to set a voltage gain. As shown in FIGS. 5A and 5B, the operational amplifiers (opamps) 501 and 551 are connected in configurations so as to have gains determined according to the ratio of capacitances of capacitors 503 and 505 (in FIG. 5A), the ratio of resistances of resistors 553 and 555, or more generally the ratio of impedances and/or reactances of the electric components (one of which has a voltage coefficient). The gains thus vary with the value of the capacitance, resistance, impedance, and/or reactance of devices 505 and 555, which are themselves determined according to the voltage across the devices 505 and 555. For measurement purposes, a stimulus of a known input voltage is applied by the signal source $V_{stim}$, and a gain of the opamp circuit is measured. The gain is measured by an ADC, transmitted to the battery system controller 160 by a WCT, and used in the battery system controller 160 to compute the common-mode potential according to the voltage coefficient of the electric component. Specifically, since the parameter is sensitive to the common-mode voltage between the battery module and the common mode (e.g., the chassis), the order of the battery modules in the stack can be determined based on the reported parameter measurements received in the battery system controller 160 from each of CMCs via their associated WCTs. Specifically, the battery system controller 160 can compare the parameter measurements received from different CMCs by, for example, sorting the list of estimated voltages in ascending order. The sorted list indicates the order of the CMCs (and associated battery modules) in the series stack between terminals 101 and 102.

As shown in FIGS. 5A and 5B, the electric components 505/555 have one terminal connected to the CMC and another terminal connected to the chassis or ground common to all modules in the battery system 100. As such, the electric components 505/555 are components that can sustain voltages equal to the operation voltage of the battery system 100 without deterioration or damage. Note that FIGS. 5A and 5B show only some components of CMCs, and CMCs will generally include additional components not shown in the figures.

In accordance with a third approach, the position of the battery module within the stack of battery modules is determined using a measurement of RF attenuation through the battery system conductors. For example, in one embodiment the lower supply ($V_{SS}$) terminal of one battery module is connected to the upper supply ($V_{DD}$) terminal of another battery module adjacent in the stack. At a first CMC, a RF-probe signal (e.g., in the ISM band) is AC-coupled onto its upper power supply ($V_{DD}$) terminal while at a second CMC, an RF-receiver is AC-coupled to the lower supply ($V_{SS}$) terminal. Since propagation of the RF-probe signal through one or more battery cells will incur loss, the RF receivers at battery modules farther away (e.g., electrically farther away in the series stack) from the point at which the RF-probe signal is applied will report a received signal strength (RSS) having less power than RF receivers at battery modules electrically-closer to the point at which the RF-probe signal is applied. Each CMC can thus report the RSS of the RF-probe signal measured in its associated battery module to the battery system controller 160. Specifically, the measured RSS data are wirelessly reported to the battery system controller 160 via the WCTs and the relative positions of the battery modules are determined in the battery system controller 160 by ordering all of the RSS measurements. In this regard, the position order of the battery modules within the stack of battery modules is determined according to the order of the RSS measurements received for each battery module.

In some embodiments, a balun or transformer is used to couple RF signals between $V_{DD}$ and a metal plate on a PCB or other ground plane local to the CMC which would function as an "rf gnd" node in relation to the coupled conductor. In another embodiment, a resistor or choke may be placed between each CMC's $V_{SS}$ terminal and the local battery module $V_{SS}$ to make the RF path of $V_{DD}$/metal plate a preferential impedance to $V_{DD}/V_{SS}$, which would be through the resistor/choke. In some embodiments, the RF transceiver of the WCT is used for the RSS measurement as opposed to providing a separate transceiver in the CMC.

Synchronous Measurements in Different Battery Modules:

Using the methods described above, the clocks in different WCTs or CMCs of the battery system 100 can be synchronized to a high accuracy. The synchronized clocks can be used to perform synchronous sampling by each of the CMCs. In particular, a voltage measurement, current measurement, or measurement operation performed by the battery system 100 can take advantage of the synchronized timing information made available by the WCTs to perform steps of: synchronizing a first and a second WCT to within a timing error (e.g., 100 µs); making a first measurement of a first battery module at a first time indicated by the first WCT; and making a second measurement of a second battery module at a second time indicated by the second WCT, wherein the first and the second times are synchronous to within the timing error. The first and second measurements are wirelessly transmitted to a transceiver of a battery system controller and, once received in the battery system controller, the battery system controller processes the first and the second measurements. The measurements can be processed to determine relative states of charge of the battery modules according to mathematical relations between the voltage or current measurements received from the plurality of wireless communication transceivers and synchronously measured by the plurality of CMCs. The measurements can be processed to determine fault states in the plurality of battery modules according to mathematical relations between the voltage or current measurements received from the plurality of wireless communication transceivers and synchronously measured by the plurality of CMCs.

In accordance with various examples, the synchronous measurements are each performed on a battery module or battery cell voltage, on a battery module or battery cell current, on a temperature of a battery module or battery cell, or the like. The measurements can be further processed between measurement and wireless transmission. The measurements can be wirelessly transmitted across a mesh network to the battery system controller and, in such a network, at least one wireless communication transceiver associated with one of the first and second battery modules may relay a message received from a transceiver of the other one of the battery modules as the message is transmitted across the network to the battery system controller.

In some implementations, the position of the battery module within the series stack of battery modules need not be recorded at a time of manufacture of the battery system. Instead, the location within the series stack may be determined and this information stored for later use. The location information may be stored in association with a unique serial number, such as a MACID of the WCT or identifier for the CMC associated with each battery module, and stored for later use by the battery system controller. In some embodiments, timing synchronization between the WCTs is used to perform ADC sampling measurements synchronously in multiple different CMCs. We note that a less stringent sense of timing can be used to sample slower-bandwidth signals (e.g., a synchronization that is between 10's of ns to 10's of microseconds). For example, an inverter operatively connected to the battery stack may have an operating frequency of 10 kHz. During the 100 us inverter periods, the current profile through the battery may vary substantially. By synchronizing the sampling of the ADC voltage of all battery modules in the battery stack, one can compare the cell capacity more accurately since all voltages are measured simultaneously—with effectively the same current level.

The synchronous sampling of all battery modules contrasts with cases when the sample measurements are unsynchronized. In such cases, the CMC may sample a high voltage or a low voltage, depending on when the sample is measured as the current changes. As a result of the changes in current, many more samples are generally needed in unsynchronized sampling cases to determine an average voltage level that is independent of current variations. By synchronously sampling all battery modules, fewer samples are needed for battery voltage measurements. Thus, a faster update of battery controller state information can be provided, along with faster power-management control loops and lower energy expenditure.

In some embodiments, an inverter is connected to the terminals 101 and 102 of the battery system to provide a transformation of the direct current (DC) power output by the battery system to a variable alternating current (AC) power. AC power can be used, for example, for traction motor control or to power a household or industrial grid-tie. The inverter operates in a periodic or quasi-periodic fashion and the sampling of a parameter of the battery modules by the CMCs is synchronized to an external signal, such as a signal provided from the inverter module that indicates a desired time for synchronous sampling of the parameter throughout the battery system or a portion thereof.

In some embodiments, the DC or AC current flowing through the battery module stack of the battery system is measured at a first location, which may be outside or inside of the battery system, using a voltage drop over a controlled or known resistance of the battery conductor, a Hall-effect sensor, an inductive pickoff (e.g., a Rogowski coil), or any other appropriate current measurement technique. The time synchronization provided by the WCTs allows sampling of the battery voltage synchronously with the current measurement in the various battery modules of the battery system. Given a simultaneous measurement of the current through the battery module stack and the voltage across the battery system, one can calculate an instantaneous impedance of the battery system: $Z(k)=V(k)/I(k)$. By gathering additional resistance measurements in this fashion, a Fourier decomposition (e.g., DFT, FFT, or the like) may be performed to yield a frequency-dependent battery impedance that can be plotted as an impedance vs. frequency plot. For some battery chemistries (e.g., Lithium-ion), the direct measurement of battery voltage provides a poor estimate of a battery state due to the flat discharge characteristics of the battery cell(s); in these and other cases, having a frequency-dependent estimate of battery impedance (e.g., internal resistance and internal reactance) provides substantially better insight into the charge-state allowing improved utilization of battery capacity, improved lifetime, and improved safety.

In some embodiments, local processing of measured data in the CMC is performed before wirelessly transmitting the data to the battery system controller via the WCT. For example, various statistics may be collected and processed locally including calculation of a mean, maximum, minimum, or root mean square (RMS), thresholding, or the like for use either locally or for sending to the battery controller wirelessly. In one example, locally computed value can be used to enable the CMC to, for example, act on a locally-detected temperature or voltage fault by throwing a bypass switch so as to bypass a battery cell without requiring involvement with the battery system controller.

In some embodiments, a local sense of time within a battery module assembly (e.g., 116), such as a sense of time determined by a local clock corrected by synchronization of the WCTs as described above, is used to time-stamp measurements performed by the battery module's CMC (e.g., to time-stamp voltage or current measurements). Corresponding time-stamps may be applied to samples made outside the battery module assembly, and/or outside of the battery system. For example, a current flow through the battery system's terminals 101 and 102 can be measured by a current-measuring circuit located outside the battery system or its housing. In this way, because the CMCs are all time-synchronized with the battery system controller, the time stamps associated with each of the voltage or current measurement samples may be used to identify and process synchronous samples even if the order at which the information arrives at the battery controller is not sequential (e.g., if the samples are received out of order, for example because of variable delay between different wireless communications paths between WCTs and the battery system controller).

In some embodiments, a message from a WCT is transmitted with a priority field to indicate the priority of the message. A message with adverse safety implications, such as a battery voltage fault, may be assigned a priority higher by a CMC or WCT transmitted the message as compared to a long term monitoring message having low time criticality. In a mesh network, when a message is assigned a higher priority, the message is identified upon reception by a receiving WCT and scheduled for re-transmission topologically-more-towards the battery controller at a priority determined by the remaining bandwidth and the priority of any additional messages to be sent.

In some embodiments, a software or a firmware update to a WCT or CMC can be used to address a deficiency in a deployed version of software or firmware or provide a new or improved feature using existing hardware. The software update is provided to the battery system controller 160 which sends the software update wirelessly, using the WCTs communicatively coupled to the battery system controller 160, to the WCTs within the battery system. Upon receipt of a complete and verified image of the new software (e.g., verified using a cyclic redundancy check (CRC), message integrity check (MIC), or other authentication technique), each WCT sends an acknowledgement to the battery system controller. When the battery system controller has determined that all WCTs have received and validated the software update, the updates are applied to all WCTs and/or CMCs simultaneously by updating data in nonvolatile memory of the WCTs and/or CMCs. By using an acknowledgement from each WCT to confirm receipt of the software update before applying the software update, situations in which a portion of the battery module assemblies are upgraded and a portion remains with legacy code is avoided. This is beneficial since different versions of software may be incompatible with each other.

In some embodiments, a battery cell or battery module is monitored by the CMC and the amount of energy, or, alternately, charge, remaining in the battery cell or battery module is estimated using measured battery parameters (current, voltage, temperature) and a model of the battery. Measurement of the amount of energy in a module or cell is useful as the battery may be adjusted to compensate for mismatch by changing the cell loading within the battery system using switches to reconfigure the network of battery modules and battery cells to more evenly consume power among cells in the battery system. Such mismatch compensation may be performed locally (using a processor of the WCT or CMC) with reporting information sent to the battery system controller, or the decisions about leveling of the battery loads may be done by the battery system controller itself with measured data sent from the CMCs to the battery system controller, processing performed at the battery system controller, and the resulting control commands sent wirelessly to the appropriate WCTs and/or CMCs in the battery system.

If a fault condition is detected by a CMC and/or WCT, the CMC and/or WCT may take an action autonomously. The fault condition may be indicative of a fault occurring in the battery module associated with the CMC or WCT, with another battery module or with the battery system, or with the CMC and/or WCT (e.g., an inability to measure a parameter). The action can be taken autonomously by the CMC and/or WCT without receiving approval or direction from the battery system controller based upon an algorithm locally contained within the CMC and/or WCT and decided upon before the fault condition. Subsequent to an autonomous action, the WCT sends a message to the battery system controller including the type of fault, the action taken, and any other appropriate information including timing. For example, if the CMC detects a condition via measuring parameters (e.g., temperature, voltage, current, or the like) that would indicate a damaged cell battery, the CMC can autonomously trigger a switch to electrically remove the offending battery cell from the battery module and re-route the battery conductor around the defective cell. An event that could be used to detect such a fault condition includes a sudden and unexpected change in voltage, a rapid rise in cell temperature, or a voltage or temperature measurement outside a defined acceptable-parameter value-space. In some embodiments, an auxiliary power source is available for the WCT in the event that power provided by the battery module is insufficient for operation. In various embodiments, a coin cell battery is used, an auxiliary battery is used, a connection to an adjacent battery module is used, a supercapacitor is used, or an energy harvester (e.g., a piezo/vibration or thermal energy harvester, an inductive coil pickoff, or the like).

In some embodiments, a fault condition occurs when a WCT does not report information to the battery system controller within a predetermined expected amount of time or time period. In this case, a fault is asserted when no data is received from a WCT during the time period, resulting in an action at both sides of the broken communication link. In one embodiment, the battery module associated with the WCT having caused the fault is placed into a safe mode using switches to bypass the battery module. At the same time, the battery system controller notes the failure of communication and performs the action of logging an identifier of the offending WCT, such as a MACID of the WCT or a location of the WCT within the battery module stack. If the fault continues or is followed by a second fault associated with the same WCT, the battery system controller goes into a safe mode so that repairs may be made to the battery system.

Each WCT and/or CMC may include a unique identifier programmed at a final test (e.g., by an automated test equipment or ATE) of the manufactured integrated battery circuit, such as a media access control (MAC) ID or a serial number. The unique number can be beneficial for various reasons including tracking for quality control; inventory tracking: verification that only valid OEM components are used (e.g., as part of protection against counterfeit parts); maintaining a history of remanufactured units; providing support for an access control list to provide additional security beyond encryption. Such a unique identifier can be used to uniquely identify the battery module (or associated CMC or WCT) when the battery module forms part of a battery system, or if it is removed from a battery system. The unique identifier is communicated wirelessly when queried using encrypted communication to avoid eavesdropping, spoofing, or other malicious attacks. In some embodiments, the unique identifier is securely assigned after final test by the manufacturer of the battery module or battery system by communicating a desired MACID to the WCT or CMC and then committing this information to a nonvolatile memory associated with the WCT or CMC.

In some embodiments, a WCT may be used as part of an inventory management system. A plurality of battery modules are placed in a location having a second WCT connected to an inventory management system. The second WCT connected to the inventory management system identifies and connects to the WCTs of the battery modules securely, and is able to download module history, unique identifier, state of charge, over- and under-voltage history, temperature extremes, etc. The inventory management system queries the state of charge reported by the CMCs for each WCT and sends an alert to an operator when the CMC determines the battery module needs to be charged (since some batteries may be impaired by extended storage at particular charge levels). In some embodiments, the second WCT may be used to transfer a software update to the WCT or CMC as part of the inventory management process.

In some embodiments, a WCT has security credentials that allow the WCT to join more than one network. The security credentials include at least two network identifiers (IDs), a unique device identifier (e.g., MACID) and a join key to allow joining to each of the two or more networks. The security credentials include a credential to communicate to a battery system controller to which the WCT has been previously assigned, as well as a credential for at least one inventory network. The inventory network may be a network located at a place of manufacture, a place of storage, a place of remanufacture, a service center, or any other situation which benefits from the ability to securely access battery modules or battery systems wirelessly in a location where a plurality of battery systems is present. A first WCT associated with a battery module searches for available networks that may be joined for which it has credentials. If the network ID corresponding to the assigned battery system controller is not found but an inventory network ID is found, the WCT joins the inventory network. If only the battery system controller network is found, the WCT joins only the battery system controller network. If both the battery system and inventory networks are found, then the WCT joins either or both networks as decided upon by either local control of the WCT or the network managers for the networks which, in some embodiments, is located in the battery system controller. When, or after, joining the inventory network, the WCT sends status data which may include state of charge, temperature, MACID, and/or any other appropriate data. Communications to the inventory network may be scheduled to occur at long intervals while in inventory (e.g., 24 hours) to save power. In some embodiments, a "blink" mode may be used to send data infrequently, as described in U.S. Patent Application Publication No. 2016/0345317, which is incorporated herein by reference in its entirety. In this embodiment, the WCT that is to send data listens for a communication from the network to which it wants to send data; encrypts that data to be sent using a security key; sends the data to another WCT within the same network; receives a link-layer acknowledgement; and, goes back to sleep until the next data packet needs to be sent. Such a reporting technique provides substantially reduced power consumption and reduced radio traffic in situations where data needs to be reported infrequently, such as in an inventory management application.

In some embodiments, each WCT within the battery system is assigned a network ID, associated with a battery system controller, wirelessly. The battery system controller has a unique MACID which prevents adjacent networks from joining or eavesdropping the controller's network. During a time of manufacture, a common network ID is programmed into all the WCTs across multiple battery systems. Next, a battery system controller, to which the battery module and associated WCT is to be assigned, is provided a unique network ID which may be generated from a list of unique numbers, or may be set by, e.g., the lower 8 bytes of a network manager's MACID. Next, the unique network ID of the battery system controller is wirelessly communicated to the other WCTs in the battery system using the common network ID. Upon receiving acknowledgements that the WCTs have all received the new network ID to be assigned, the new network ID is committed to a nonvolatile memory locally stored in each WCT. The network is then reset and reformed using the new unique network ID. To prevent communication between a network manager and a non-target battery-assembly, various techniques may be used including: a reduced communication power to limit propagation distance of wireless signals to the instant battery system and its housing; an access control list comprising a list of target WCT MACIDs with which the network manager is to be communicating, which may be identified by optical scanning of a bar code indicating a MACID on the battery system or its housing.

In some embodiments, a WCT continuously searches for other potential paths through the network to the battery system controller 160. The WCT can also or alternatively continuously search for a path quality metric. The WCT stores that the other potential path information and/or the path quality metric information locally, sends the information to a network manager, sends that information more topologically-towards the battery system controller or a WCT connected to the battery system controller. A path quality metric is a metric of the robustness of a communication link and may be indicative of a received signal strength (RSSI), a link quality indicator, a path stability (e.g., a percentage of transmitted packets that have been acknowledged), or a signal-to-noise-ratio (SNR). In the event of a path failure between any nodes, an already detected path can be quickly assigned to replace the failed one either locally or by a network manager. Additionally, through continuous path quality optimization, new discovered paths can be tried and, if proven to be of superior quality than the ones already in use, can be swapped out either locally or by the network manager.

In some embodiments, the wireless communication is performed according to a schedule (e.g., a frame) which includes a time and a channel (e.g., frequency channel) for each communication. In some embodiments, the wireless communication is performed according to a first schedule and a second schedule at least one of which is adjustable between an active and an inactive state. In the inactive state, the schedule information is maintained by the WCT but is not used for communication. When the inactive schedule is activated, additional bandwidth and wireless communication links are made available. A benefit of such dual-schedule communication is network bandwidth may be quickly adjusted to allow for increased throughput or lower latency without having to propagate a new schedule or adjust the existing schedule (which takes time, communication bandwidth, and power) since the schedules are already stored locally and are simply awaiting activation. The schedules are propagated to WCTs at time of manufacture, at initial network formation, over time, or as part of a network grooming/configuration process by a network manager. In one embodiment, a first frame has a minimum number of slots required for a WCT to stay in the network, and the first frame is always active; a second frame contains a larger number of communication slots, which is required to allow the flow of high frequency and/or low latency data reporting. The second frame is activated as soon as a different network communication characteristic (e.g., bandwidth, latency, reliability, or the like) is desired by propagation of a wireless command from the network manager indicating the second frame should be activated, for example when the battery is actively being used. When the network communication characteristic changes again to require a lower communication requirement, the second frame is deactivated saving energy and reducing wireless traffic.

In some embodiments, multiple access points are used to provide additional system bandwidth or reliability. A dual-access point (AP) system has two WCTs providing information to the battery system controller (e.g., as shown in FIG. 2), with each WCT serving as an AP having a separate location thereby providing spatial diversity. Such a system provides improved wireless connectivity between the battery system controller or network manager and the WCTs associated with CMCs within the battery system. A single AP network can also be used.

In some embodiments, the WCTs within the battery modules of a battery system have a unique network ID, join key, password, or other security credential so that battery systems within radio communication range of each other (e.g., battery systems in two cars parked adjacent to each other in a parking lot) don't wirelessly connect to a non-authorized battery system or battery system controller through a WCT.

In some embodiments, a nonvolatile memory that is associated with the WCT or the CMC is used to store a calibration parameter (e.g., a scale factor correction for an ADC, a reference temperature coefficient, or frequency reference calibration); an identification (e.g., a version number of hardware or software); a date of manufacture, a date of remanufacture, a date of last maintenance, or any other appropriate date or time, or a mission profile indicating a desired operating point in the operating space comprising: how the cells are charged (time/% of capacity); how the cells are discharged (% depth of discharge); the maximum temperature allowed during charging; thresholds for applying a leveling algorithm); a hardware configuration parameter (e.g., a piece of data indicating the configuration of the cells within the battery module (e.g., a topology similar to FIGS. 3A-3D). Local storage of such parameters may provide reduced communication requirements on the wireless communication since some of the information required by the WCTs and the CMCs are stored locally and immediately available for use without transmission from the battery system controller.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the detailed description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A battery system monitor for monitoring a battery system having a plurality of battery modules each including a pair of terminals, wherein terminals of the battery modules are interconnected such that the battery modules are coupled in series with each other between first and second terminals of the battery system, the battery system monitor comprising:
   a plurality of cell measurement circuits (CMCs) each configured to measure a voltage at or current through a pair of terminals of an associated battery module;
   a plurality of wireless communication transceivers each associated with a different CMC of the plurality of CMCs and configured to transmit voltage or current measurement information of the associated CMC across a wireless communication link; and
   a controller configured to receive the voltage or current measurement information from the plurality of wireless communication transceivers and determine relative positions of the battery modules associated with the CMCs in the series coupling between the first and second terminals of the battery system based on a comparison of timing of occurrence of an identified artifact in a time-series of respective voltage or current measurement information from two or more of the plurality of wireless communication transceivers.

2. The battery system monitor of claim 1, wherein each of the plurality of CMCs and each of the plurality of wireless communication transceivers are electrically isolated from at least one of the first and second terminals of the battery system.

3. The battery system monitor of claim 1, wherein the controller is configured to determine a battery system fault based on the voltage or current measurement information received from the plurality of wireless communication transceivers, and the action is to cause shut down of operation of the battery system upon determining the battery system fault.

4. The battery system monitor of claim 1, wherein the controller determines the relative positions of the battery modules associated with the CMCs in the series coupling between the first and second terminals of the battery system by performing steps of: identifying the artifact in a time-series of voltage or current measurements received from a first wireless communication transceiver; identifying the artifact in a time-series of voltage or current measurements received from a second wireless communication transceiver; comparing timing of occurrence of the identified artifact in the time-series of voltage or current measurements received from the first and second wireless communication transceivers; and determining the relative positions in the series coupling of the battery modules associated with the CMCs associated with the first and second wireless communication transceivers based on the compared timing of occurrence of the identified artifact in the time-series.

5. The battery system monitor of claim 4, wherein:
   the artifact is a sudden change in the time-series of voltage or current measurements resulting from a change in signal or load applied at the first and second terminals of the battery system; and
   the determining comprises determining that a battery module associated with a CMC in which the artifact occurs sooner is located closer to one of the first and second terminals of the battery system as compared to a battery module associated with a CMC in which the artifact occurs later.

6. The battery system monitor of claim 4, wherein:
the artifact is a sudden change in the time-series of voltage or current measurements resulting from a signal or load applied to the series connection of battery modules; and
the determining comprises determining that a battery module associated with a CMC in which the artifact occurs sooner is located closer to a location at which the signal or load is applied in the series connection of battery modules as compared to a battery module associated with a CMC in which the artifact occurs later.

7. The battery system monitor of claim 1, wherein:
each wireless communication transceiver or CMC has a clock,
each wireless communication transceiver is operative to synchronize its clock or the clock of the associated CMC with a clock of another wireless communication transceiver, of another CMC, or of the controller, and
each CMC of the plurality of CMCs is configured to measure the voltage or current of the respective battery module synchronously with measurements performed by other CMCs of the plurality of CMCs at sample times determined according to the synchronized clock.

8. The battery system monitor of claim 7, wherein each wireless communication transceiver is operative to synchronize its clock or the clock of the associated CMC by performing steps of:
measuring a propagation time for packets transmitted between the wireless communication transceiver and another wireless communication transceiver;
determining whether the measured propagation time is equal to a difference between a transmission timestamp and a reception timestamp for a packet transmitted between the wireless communication transceiver and the other wireless communication transceiver; and
adjusting the clock of the wireless communication transceiver if the measured propagation time is not equal to the difference between the timestamps.

9. The battery system monitor of claim 8, wherein measuring the propagation time for packets transmitted between the wireless communication transceiver and the other wireless communication transceiver comprises:
recording a transmission timestamp and a reception timestamp for a first packet transmitted from the wireless communication transceiver to the other wireless communication transceiver;
recording a transmission timestamp and a reception timestamp for a second packet transmitted from the other wireless communication transceiver to the wireless communication transceiver; and
computing the propagation time as the average of differences between the transmission timestamp and the reception timestamp for each of the first and second packets.

10. The battery system monitor of claim 7, wherein each wireless communication transceiver transmits across the wireless communication link the voltage or current measurement information of the associated CMC with a timestamp for the voltage or current measurement.

11. The battery system monitor of claim 7, wherein the action is to determine relative states of charge of the plurality of battery modules or fault states in the plurality of battery modules according to relationships between the voltage or current measurements received from the plurality of wireless communication transceivers and synchronously measured by the plurality of CMCs.

12. The battery system monitor of claim 7, wherein each wireless communication transceiver is operative to synchronize its clock or the clock of the associated CMC by performing steps of:
recording a transmission timestamp indicative of a time of transmission of a first packet transmitted from the wireless communication transceiver to the other wireless communication transceiver;
receiving from the other wireless communication transceiver a reception timestamp indicative of a time of reception of the first packet at the other wireless communication transceiver; and
adjusting the clock of the wireless communication transceiver or the associated CMC according to a difference between the transmission timestamp and the reception timestamp associated with the first packet.

13. The battery system monitor of claim 7, wherein each wireless communication transceiver includes a frequency tracking loop or a phase tracking loop operative to track the time keeping properties of the clock of the other wireless communication transceiver, of the other CMC, or of the controller.

14. The battery system monitor of claim 7, wherein each wireless communication transceiver stores a time-varying security parameter used for authenticating other wireless communication transceivers of the battery system.

15. The battery system monitor of claim 1, further comprising:
a plurality of circuit components each associated with a different CMC of the plurality of CMCs, each coupled between a common node and a node of the associated CMC, and each having an impedance or reactance that varies with the voltage across the circuit component,
wherein each CMC is configured to measure an impedance or reactance of the associated circuit component, each wireless communication transceiver is configured to transmit the impedance or reactance measurement of the associated CMC across the wireless communication link.

16. The battery system monitor of claim 1, wherein each wireless communication transceiver stores a first security credential required for communication with other wireless communication transceivers of the battery system and a second security credential required for communication with an inventory management system.

17. The battery system monitor of claim 1, wherein each wireless communication transceiver is further configured to receive a receipt-acknowledgment following the transmitting of the voltage or current measurement information of the associated CMC across the wireless communication link and, upon determining that the receipt-acknowledgment has not been received within a predetermined time period, re-transmit the voltage or current measurement information of the associated CMC.

18. A method for monitoring a battery system having a plurality of battery modules coupled in series with each other between first and second terminals of the battery system, and at least one wireless communication transceiver associated with a battery module of the plurality of battery modules, the method comprising:
establishing at least one wireless communication link between a controller of the battery system and the plurality of battery modules;

receiving, at the controller, from the at least one wireless communication link, voltage or current measurement information for each of the plurality of battery modules; and determining, by the controller, relative positions of the battery modules associated with the CMCs in the series coupling between the first and second terminals of the battery system based on a comparison of timing of occurrence of an identified artifact in a time-series of respective based on measurement information received for two or more of the plurality of battery modules.

19. A system for wirelessly monitoring a battery that includes a plurality of battery modules, the system comprising:

a plurality of cell measurement circuits (CMCs) each configured to measure a voltage across or current through an associated battery module;

a plurality of transceivers each associated with a different CMC of the plurality of CMCs and configured to wirelessly transmit voltage or current measurement information of the associated CMC; and a controller configured to receive the voltage or current measurement information from the plurality of wireless communication transceivers and determine relative positions of the battery modules associated with the CMCs in the series coupling between the first and second terminals of the battery system based on a comparison of timing of occurrence of an identified artifact in a time-series of respective voltage or current measurement information from two or more of the plurality of wireless communication transceivers.

* * * * *